(12) United States Patent
Nishimura

(10) Patent No.: US 12,413,205 B2
(45) Date of Patent: Sep. 9, 2025

(54) RESONATOR AND RESONANCE DEVICE

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 496 days.

(21) Appl. No.: 17/540,324

(22) Filed: Dec. 2, 2021

(65) Prior Publication Data
US 2022/0094332 A1 Mar. 24, 2022

Related U.S. Application Data

(63) Continuation of application No. PCT/JP2020/013712, filed on Mar. 26, 2020.

(30) Foreign Application Priority Data

Jun. 17, 2019 (JP) .................................. 2019-112082

(51) Int. Cl.
*H03H 9/24* (2006.01)
*H03H 9/05* (2006.01)
(Continued)

(52) U.S. Cl.
CPC ........ *H03H 9/2405* (2013.01); *H03H 9/0538* (2013.01); *H03H 9/1057* (2013.01); *H03H 9/171* (2013.01)

(58) Field of Classification Search
CPC .. H03H 9/05; H03H 9/10; H03H 9/17; H03H 9/24
See application file for complete search history.

(56) References Cited

U.S. PATENT DOCUMENTS

| 6,914,368 B2 * | 7/2005 | Nakamura ......... H03H 9/02015 |
| | | 310/365 |
| 7,586,239 B1 * | 9/2009 | Li ........................ H03H 9/2436 |
| | | 333/186 |

(Continued)

FOREIGN PATENT DOCUMENTS

| JP | 3139274 B2 | 2/2001 |
| JP | 2013143640 A | 7/2013 |

(Continued)

OTHER PUBLICATIONS

International Search Report issued in PCT/JP2020/013712, dated Jun. 16, 2020.

(Continued)

*Primary Examiner* — Andrea Lindgren Baltzell
*Assistant Examiner* — Alan Wong
(74) *Attorney, Agent, or Firm* — ArentFox Schiff LLP

(57) ABSTRACT

A resonator is provided that includes a vibration part, a frame, and a support arm. The vibration part includes an Si substrate that has a principal surface with a width W in an X-axis direction and a length L in a Y-axis direction. The vibration part is configured to vibrate mainly in a contour vibration mode. The support arm extends in the Y-axis direction and connects the frame to one of two ends in the Y-axis direction of the vibration part. When the principal surface of the Si substrate is viewed in a plan view, the width W is at its maximum Wmax at a point in the Y-axis direction and decreases with increasing proximity to the one of the two end portions in the Y-axis direction of the vibration part and with increasing proximity to the other end portion in the Y-axis direction of the vibration part.

18 Claims, 17 Drawing Sheets

(51) Int. Cl.
*H03H 9/10* (2006.01)
*H03H 9/17* (2006.01)

(56) References Cited

U.S. PATENT DOCUMENTS

| | | | | |
|---|---|---|---|---|
| 7,834,526 | B2* | 11/2010 | Yamada | H03H 9/02023 310/366 |
| 7,940,145 | B2* | 5/2011 | Isobe | H03H 3/02 333/187 |
| 8,729,779 | B2* | 5/2014 | Perez | H03H 9/2405 310/365 |
| 8,907,549 | B2* | 12/2014 | Saito | H03H 3/02 333/187 |
| 8,957,569 | B2* | 2/2015 | Yamaguchi | H03H 9/205 310/348 |
| 9,543,923 | B2* | 1/2017 | Yamada | H03H 9/02023 |
| 10,158,340 | B1* | 12/2018 | Wu | H03H 9/505 |
| 11,108,373 | B2* | 8/2021 | Nishimura | H03H 9/02031 |
| 11,329,624 | B2* | 5/2022 | Goto | H03H 9/0595 |
| 11,489,512 | B2* | 11/2022 | Nishimura | H03H 9/2463 |
| 2019/0109578 | A1* | 4/2019 | Goto | H03H 9/0595 |
| 2020/0119714 | A1 | 4/2020 | Nishimura et al. | |

FOREIGN PATENT DOCUMENTS

| | | | |
|---|---|---|---|
| JP | 2015167222 A | 9/2015 | |
| JP | 2017169107 A | 9/2017 | |
| WO | WO-2017203741 A1 * | 11/2017 | B81B 3/00 |
| WO | 2018008198 A1 | 1/2018 | |
| WO | WO-2018008480 A1 * | 1/2018 | B81B 3/0045 |
| WO | WO-2019008830 A1 * | 1/2019 | H03B 5/32 |

OTHER PUBLICATIONS

Written Opinion of the International Search Report issued in PCT/JP2020/013712, dated Jun. 16, 2020.

* cited by examiner

FIG. 3
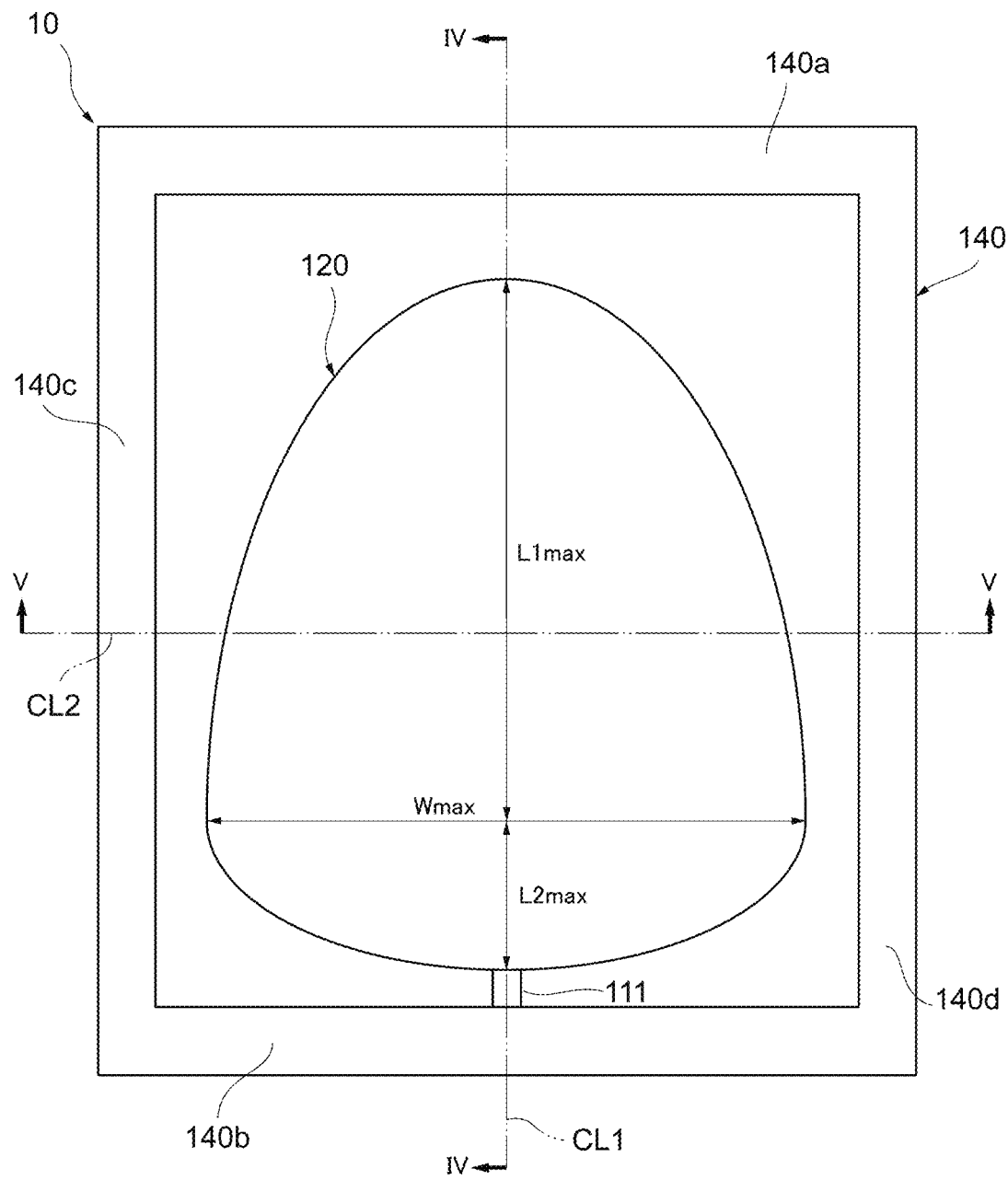
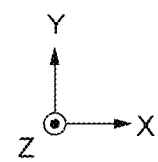

FIG. 7
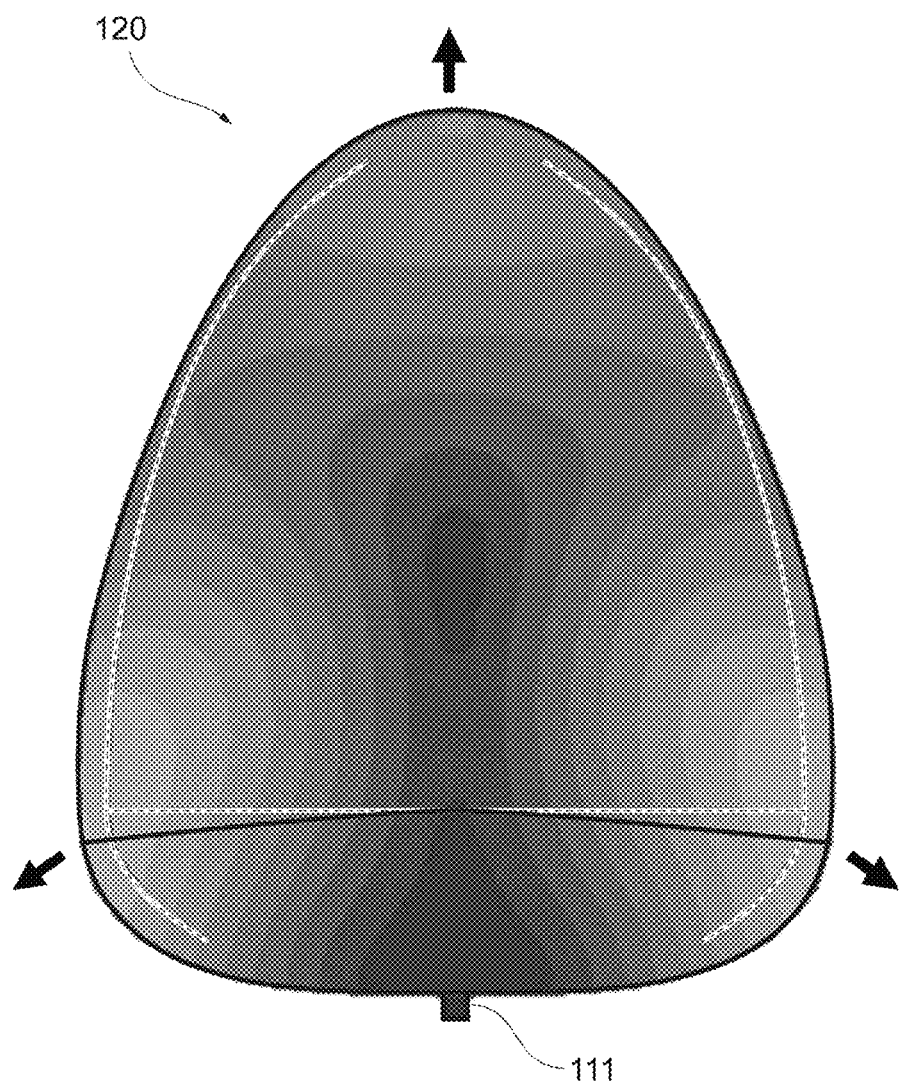
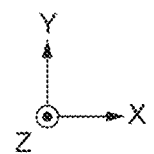

FIG. 12
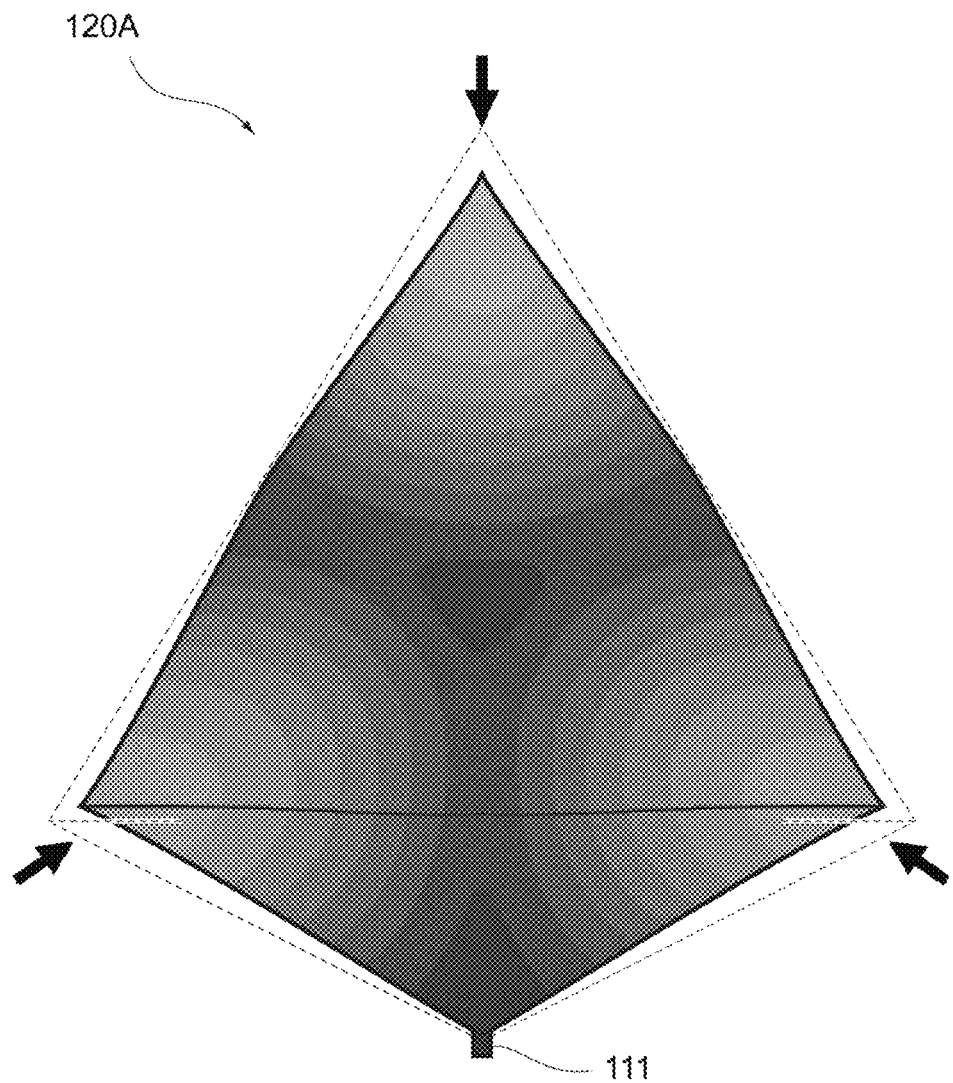
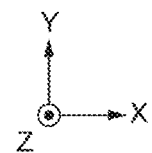

RESONATOR AND RESONANCE DEVICE

CROSS REFERENCE TO RELATED APPLICATIONS

The present application is a continuation of PCT/JP2020/013712 filed Mar. 26, 2020, which claims priority to Japanese Patent Application No. 2019-112082, filed Jun. 17, 2019, the entire contents of each of which are incorporated herein by reference.

TECHNICAL FIELD

The present invention relates to a resonator configured to vibrate in a contour vibration mode and to a resonance device.

BACKGROUND

Resonance devices equipped with micro-electro-mechanical systems (MEMS) are currently used as timing devices. Such resonance devices are mounted on a printed wiring board embedded in an electronic apparatus, such as a smartphone. A typical resonance device includes a lower substrate, an upper substrate, and a resonator disposed in a cavity defined between the lower substrate and the upper substrate.

A vibrator disclosed in Japanese Patent No. 3139274 (hereinafter "Patent Document 1") adopts a width expansion mode. The vibrator includes a resonance part that includes a piezoelectric body shaped like a cuboid and resonant electrodes provided on outer surfaces of the piezoelectric body. The resonance part has a pair of rectangular surfaces opposite in the polarization direction of the piezoelectric body. Moreover, a ratio b/a stands at a predetermined value with a margin of error of plus or minus 10%, where a and b respectively represent lengths of a long side and a short side of each of the rectangular surfaces, and a represents the Poisson's ratio of the material of the piezoelectric body. When an alternating voltage is applied between the resonant electrodes, the resonance part is excited in the width expansion mode, with the width direction being the direction in which the short sides extend.

When the vibrator disclosed in Patent Document 1 is viewed in the plan view, the midsection of each of the short sides of the rectangular resonance part is a node region in which the amount of displacement is small. The same holds for a resonator including a vibration part that is rectangular when viewed in the plan view. Each node region in such a conventional resonator is provided with a support part that forms a connection between the resonator and the corresponding holding part of the resonator. This structure eliminates or reduces the possibility of escape of vibrations from the vibration part into the holding part through the support part.

Although the amount of displacement in the node regions of the vibration part is small, the node regions can be highly distorted. The distortion of the node regions can cause escape of vibrational energy of the vibration part into the holding part through the support part. Thus, there is a limit to the extent to which the escape of vibrations is prevented.

SUMMARY OF THE INVENTION

Accordingly, it is an object of the present invention to provide a resonator and a resonance device that further improves the prevention of escape of vibrations.

A resonator according to an exemplary aspect includes a vibration part (also referred to as a "vibrator"), a holding part (also referred to as a "frame"), and a support part (also referred to as a "support"). The vibration part includes a substrate having a first principal surface with a width in a first direction and a length in a second direction. The vibration part is configured to vibrate mainly in a contour vibration mode. The vibration part is at least partially surrounded by the holding part. The support part extends in the second direction to form a connection between the holding part and one of two end portions in the second direction of the vibration part. When the first principal surface of the substrate of the vibration part is viewed in a plan view, the width in the first direction is at its maximum at a point in the second direction and decreases with increasing proximity to the one of the two end portions in the second direction of the vibration part and with increasing proximity to the other end portion in the second direction of the vibration part.

Moreover, a resonance device according to another exemplary aspect includes the resonator and a cover coupled thereon.

The exemplary embodiment of the present invention further improves the prevention of escape of vibrations.

BRIEF DESCRIPTION OF DRAWINGS

FIG. 3 is a plan view of a resonator in FIG. 2, schematically illustrating the structure of the resonator.

FIG. 7 is a plan view of the vibration part in FIG. 3, schematically illustrating a mode in which the vibration part vibrates.

FIG. 12 is a plan view of a vibration part in FIG. 11, schematically illustrating a mode in which the vibration part vibrates.

DETAILED DESCRIPTION OF EMBODIMENTS

Hereinafter, exemplary embodiments of the present invention will be described. In the accompanying drawings, the same or like reference signs denote the same or like constituent elements. It is noted that the accompanying drawings are provided merely as examples. The individual elements are schematically illustrated in terms of their dimensions and shapes. The following exemplary embodiments should not be construed as limiting the technical scope of the present invention.

First Exemplary Embodiment

Figure 1:
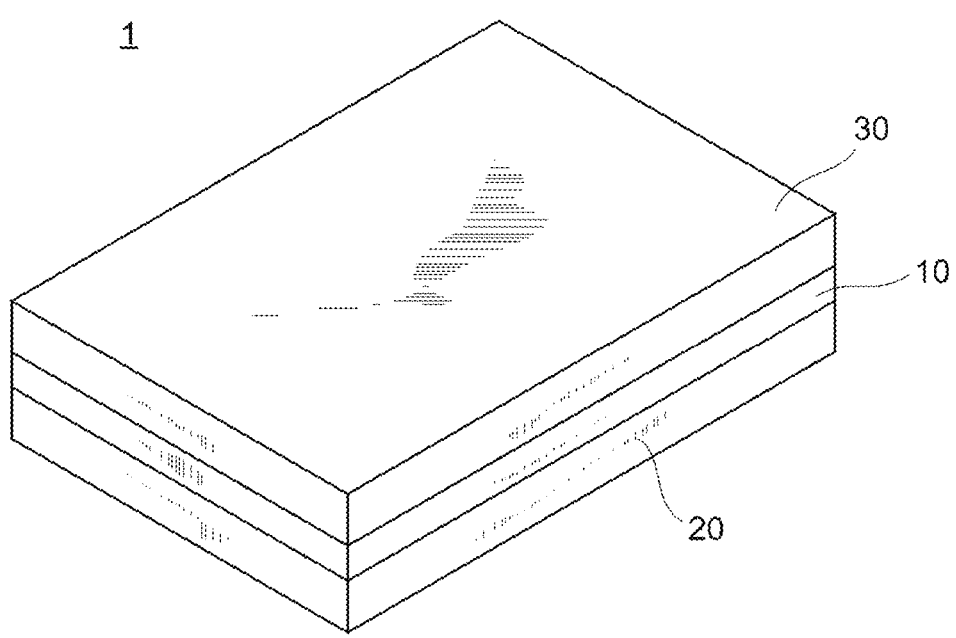
FIG. 1 is a schematic external perspective view of a resonance device according to a first exemplary embodiment.
Figure 2:
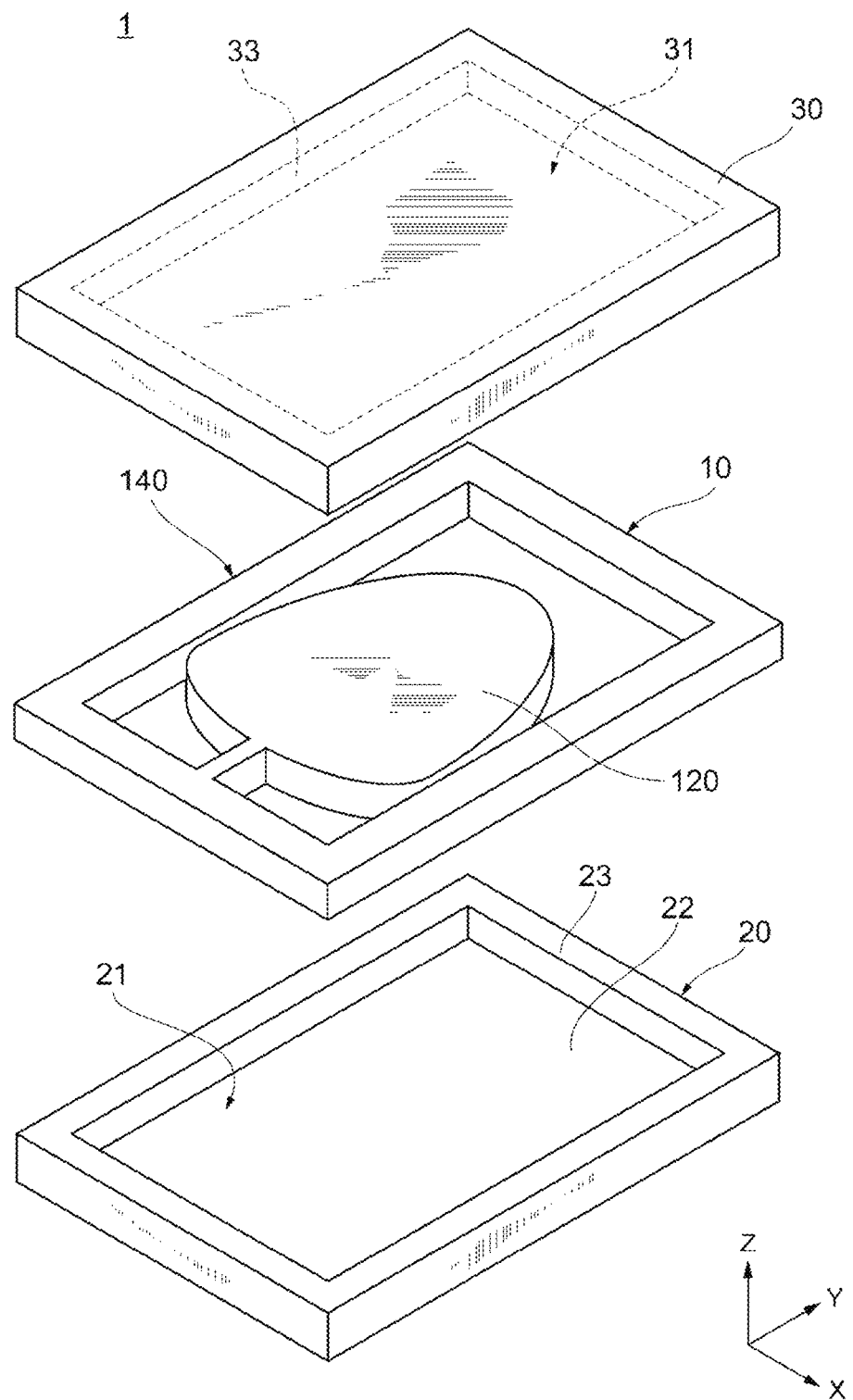
FIG. 2 is an exploded perspective view of the resonance device in FIG. 1, schematically illustrating the structure of the resonance device.

The following provides an overview of the configuration of a resonance device according to a first exemplary embodiment with reference to FIGS. 1 and 2. FIG. 1 is a schematic external perspective view of a resonance device 1 according to the first embodiment. FIG. 2 is an exploded perspective view of the resonance device 1 in FIG. 1, schematically illustrating the structure of the resonance device 1.

As shown, the resonance device 1 includes a resonator 10, a lower cover 20, and an upper cover 30. More specifically, the lower cover 20, the resonator 10, and the upper cover 30 of the resonance device 1 are stacked in this order. The lower cover 20 and the upper cover 30 are examples of a cover according to the present disclosure.

The following describes the individual elements of the resonance device 1. The following description will be given assuming that the resonance device 1 is placed with the upper cover 30 on an upper side (i.e., on a top side) and the lower cover 20 on a lower side (i.e., on a back side).

In general, micro-electro-mechanical systems (MEMS) can be used to produce the resonator 10, which is thus regarded as a MEMS resonator. The resonator 10, the lower cover 20, and the upper cover 30 are joined together. The resonator 10, the lower cover 20, and the upper cover 30 are each formed by using, for example, a silicon substrate (hereinafter referred to as an Si substrate). The Si substrates are bonded together. In some embodiments, the resonator 10 and the lower cover 20 may each be formed by using a silicon-on-insulator (SOI) substrate.

The upper cover 30 is in the form of a flat plate lying in an X-Y plane and has a recess 31 on its back surface. The recess 31 is shaped like a thin cuboid. The recess 31 is enclosed with a side wall 33, and a vibration space in which the resonator 10 vibrates is partially defined by the recess 31. In some embodiments, the upper cover 30 may be in the form of a flat plate devoid of the recess 31. Moreover, a getter layer may be provided on a surface of the recess 31 of the upper cover 30 in a manner so as to face the resonator 10.

The lower cover 20 includes a bottom plate 22 and a side wall 23. The bottom plate 22 is in the form of a rectangular flat plate lying in an X-Y plane. The side wall 23 extends from a peripheral edge portion of the bottom plate 22 in a Z-axis direction, that is, in the direction in which the lower cover 20 and the resonator 10 are stacked. The lower cover 20 has a recess 21 on its surface facing the resonator 10. The recess 21 is defined by a top surface of the bottom plate 22 and an inner surface of the side wall 23. The vibration space for the resonator 10 is partially defined by the recess 21. In some embodiments, the lower cover 20 may be in the form of a flat plate devoid of the recess 21. A getter layer may be provided on a surface of the recess 21 of the lower cover 20 in a manner so as to face the resonator 10.

The vibration space for the resonator 10 is sealed airtight by the upper cover 30 and the lower cover 20 and maintained under vacuum accordingly. In an exemplary aspect, the vibration space may be filled with gas, such as an inert gas.

The following provides an overview of the configuration of the resonator according to the first embodiment with reference to FIG. 3. FIG. 3 is a plan view of the resonator 10 in FIG. 2, schematically illustrating the structure of the resonator 10.

Referring to FIG. 3, the resonator 10 is produced by using MEMS and is thus regarded as a MEMS resonator. The resonator 10 includes a vibration part 120 (also referred to as a "vibrator" or "vibration member"), a holding part 140 (also referred to as a "frame"), and a support arm 111 (also referred to as a "support" or "connection arm"). The support arm 111 is an example of a support part according to the present disclosure.

The vibration part 120 includes a silicon substrate, which is hereinafter referred to as an Si substrate and denoted by F2. One of two principal surfaces of the Si substrate F2 faces the upper cover 30. The width of the principal surface is in an X-axis direction and is denoted by W. The length of the principal surface is in a Y-axis direction and is denoted by L. The Si substrate F2 will be described later. The vibration part 120 is configured to vibrate mainly in the contour vibration mode, as will be described later. The outline of the Si substrate F2 coincides with or substantially conforms to the outline of the vibration part 120. Unless otherwise specified, the width and the length of the vibration part 120 viewed in plan are as defined in relation to the one of the principal surfaces of the Si substrate F2. That is, the width of the vibration part 120 viewed in plan is in the X-axis direction and is denoted by W, and the length of the vibration part 120 viewed in plan is in the Y-axis direction and is denoted by L.

When the surface of the vibration part 120 facing the upper cover 30 is viewed in plan, the vibration part 120 has an ovoid outline extending in the X-Y plane of the Cartesian coordinate system illustrated in FIG. 3. The vibration part 120 is disposed on the inner side with respect to the holding part 140. In the exemplary aspect, the vibration part 120 and the holding part 140 are arranged with a predetermined amount of clearance left therebetween.

Referring to FIG. 3, the vibration part 120 viewed in plan has a shape that is a combination of two semi-ellipses, with the shorter diameter of one semi-ellipse coinciding with the longer diameter of the other semi-ellipse. However, it is noted that it is not required that the vibration part 120 be composed of two semielliptical members that are joined together or connected to each other. For example, the vibration part 120 may be a single member, in which case the vibration part 120 is formed into the specified shape by micromachining, using MEMS.

The lengths in the Y-axis direction of two semielliptical portions forming the vibration part 120 are denoted by L. The maximum of the length L of one of the semielliptical portions is at its maximum L1max at a point through which the major axis of the corresponding ellipse passes. The length L of the other semielliptical portion is at its maximum L2max at a point through which the minor axis of the corresponding ellipse passes.

The width in the X-axis direction of the vibration part 120 is denoted by W and is at its maximum Wmax at a point on a boundary between the two semielliptical portions adjoining each other in the Y-axis direction. With the width W in the X-axis direction of the vibration part 120 being at its maximum Wmax at the point on the Y axis, the width W progressively decreases with increasing proximity to one of two end portions in the Y-axis direction (i.e., a lower end portion in FIG. 3) of the vibration part 120 and with increasing proximity to the other end portion in the Y-axis direction (i.e., an upper end portion in FIG. 3) of the vibration part 120. According to the exemplary aspect, the vibration part 120 constructed to be shaped as above offers the following advantage: an end portion of the vibration part includes a node region in which the amount of displacement associated with the contour vibration is small and the level of distortion associated with the contour vibration is low.

As illustrated in FIG. 3, the point on the Y axis at which the width W in the X-axis direction is at its maximum Wmax is not located on a center line CL2, which passes through the center in the Y-axis direction of the vibration part 120. More specifically, the point concerned is closer than the center line CL2 passing through the center in the Y-axis direction of the vibration part 120 to one of two end portions in the Y-axis direction (i.e., the end portion on the negative side in the Y-axis direction in FIG. 3) of the vibration part 120.

In the present embodiment, the maximum L1max of the length L in the Y-axis direction of one of the two semielliptical portions is 0.9 times the maximum Wmax of the width W in the X-axis direction. The maximum L2max of the length L in the Y-axis direction of the other semielliptical portion is 0.25 times the maximum Wmax of the width W in the X-axis direction. In an exemplary aspect, the maximum Wmax of the width W in the X-axis direction may be about 160 µm. With the length L in the Y-axis direction being greater than the width W in the X-axis direction, the vibration part 120 is long in the Y-axis direction.

The top surface of the vibration part 120 (i.e., the surface facing the upper cover 30) is entirely overlaid with a protective film 125, which will be described later in detail.

The holding part 140 is in the form of a rectangular frame and extends in the X-Y plane in such a manner that the vibration part 120 is enclosed in the holding part 140. The holding part 140 is not necessarily in the form of a continuous frame. It is only required that the vibration part 120 be at least partially surrounded by the holding part 140. More specifically, it is only required that the holding part 140 extending along at least part of the periphery of the vibration part 120 be long enough to hold the vibration part 120 and to ensure that the upper cover 30 and the lower cover 20 are joined together.

Moreover, the holding part 140 in the present embodiment includes frame members that are rectangular prisms combined into one and denoted by 140a, 140b, 140c, and 140d, respectively. Referring to FIG. 3, the frame members 140a and 140b face the short sides of the vibration part 120, with the longitudinal direction of the frame members 140a and 140b coinciding with the X-axis direction. The frame members 140c and 140d face long sides of the vibration part 120, with the longitudinal direction of the frame members 140c and 140d coinciding with the Y-axis direction. One end of the frame member 140c is connected to the corresponding end of the frame member 140a, and the other end of the frame member 140c is connected to the corresponding end of the frame member 140b. Likewise, one end of the frame member 140d is connected to the corresponding end of the frame member 140a, and the other end of the frame member 140d is connected to the corresponding end of the frame member 140b.

The support arm 111 is disposed on the inner side with respect to the holding part 140. The support arm 111 extends in such a manner that the longitudinal direction thereof coincides with the Y-axis direction. The support arm 111 forms a connection between the vibration part 120 and the holding part 140. More specifically, one end (i.e., a lower end in FIG. 3) of the support arm 111 is connected to the frame member 140b, and the other end (i.e., an upper end in FIG. 3) of the support arm 111 is connected to one of two end portions in the Y-axis direction (i.e., the lower end portion in FIG. 3) of the vibration part 120. To be more precise, the other end of the support arm 111 is connected to the midsection in the X-axis direction of the end portion of the vibration part 120. As illustrated in FIG. 3, the support arm 111 is substantially symmetric with respect to an imaginary plane lying in the Y-Z plane and extending along a center line CL1, which passes through the center in the X-axis direction of the vibration part 120.

The resonator in the present embodiment includes one support arm 111. However, in some embodiments, the end portion of the vibration part 120 may be connected with two or more support arms 111 that cantilever from the holding part 140 to support the vibration part 120.

Figure 4:
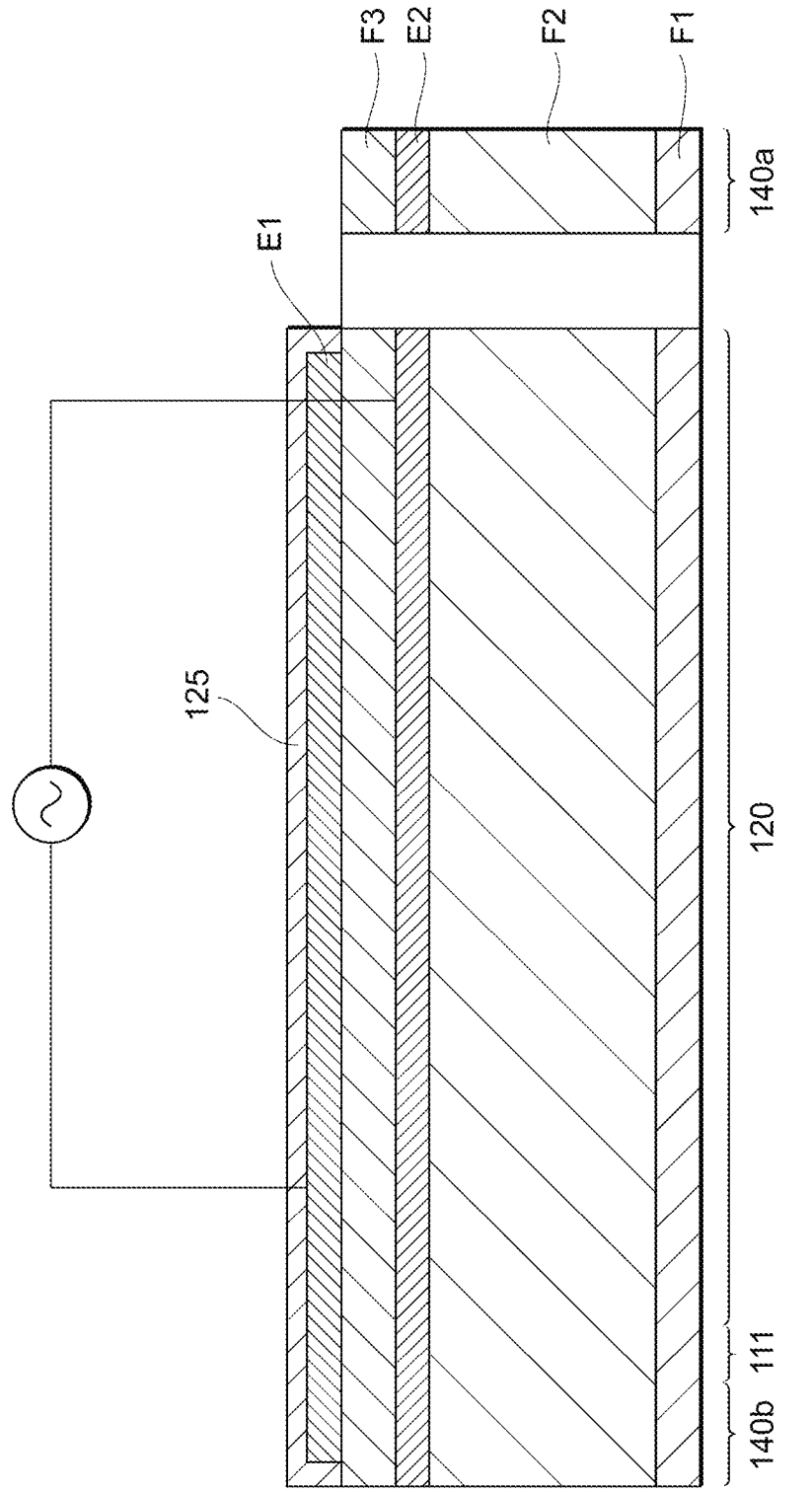
FIG. 4 is a schematic sectional view of the resonator taken along line IV-IV in FIG. 3.
Figure 5:
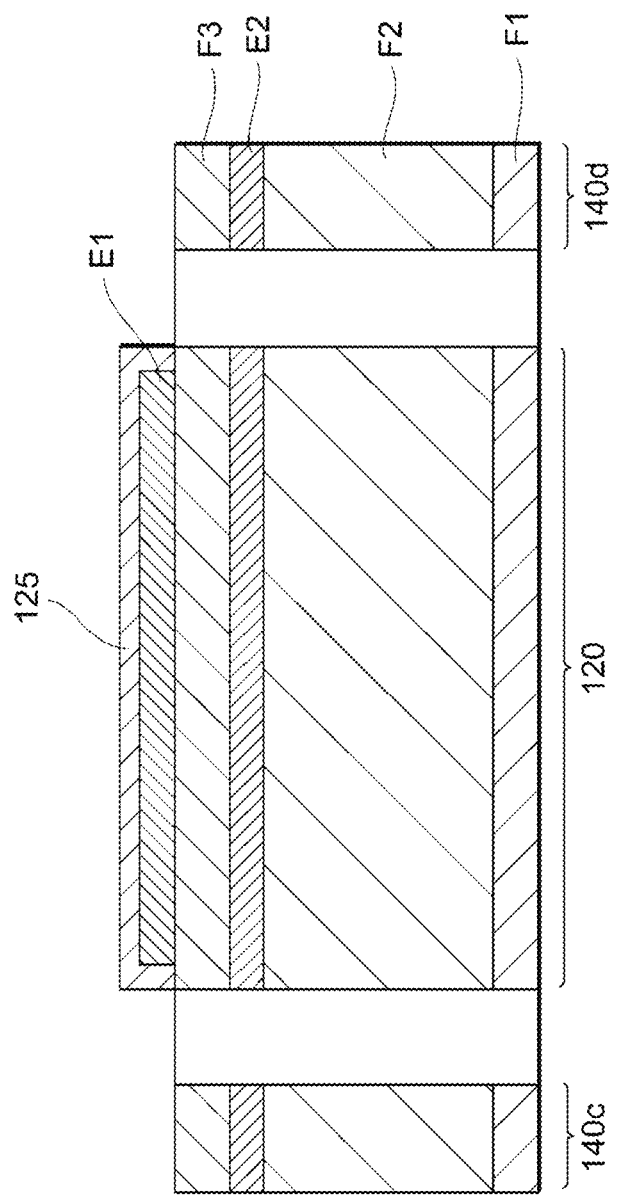
FIG. 5 is a schematic sectional view of the resonator taken along line V-V in FIG. 3.

The following describes a multilayer structure of the resonator according to the first embodiment of the present invention with reference to FIGS. 4 and 5. FIG. 4 is a schematic sectional view of the resonator taken along line IV-IV in FIG. 3. FIG. 5 is a schematic sectional view of the resonator taken along line V-V in FIG. 3.

The vibration part 120, the holding part 140, and the support arm 111 of the resonator 10 are integrally formed in the same process. Referring to FIG. 4, one of two principal surfaces (e.g., an upper surface) of the Si substrate F2 included in the vibration part 120 of the resonator 10 and having a thickness of about 24 µm is overlaid with a metal layer E2. The metal layer E2 is overlaid with a piezoelectric thin film F3, and a metal layer E1 is stacked on top of the piezoelectric thin film F3. The metal layer E1 is overlaid with the protective film 125. For purposes of this disclosure, the Si substrate F2 is an example of a substrate, and the piezoelectric thin film F3 is an example of a piezoelectric layer. Moreover, the upper surface of the Si substrate F2 is an example of a first principal surface.

The Si substrate F2 is included in the vibration part 120. Referring to FIG. 3, the width in the X-axis direction of the upper surface of the Si substrate F2 is denoted by W, and the length in the Y-axis direction of the upper surface of the Si substrate F2 is denoted by Y.

In the exemplary aspect, the substrate made of silicon (Si) and included in the vibration part 120 provides added mechanical strength to the vibration part 120.

Moreover, the Si substrate F2 may, for example, be made of a degenerate n-type silicon (Si) semiconductor. The degenerate n-type silicon (Si) may be doped with n-type dopants such as phosphorus (P), arsenic (As), and antimony (Sb). The resistance of the degenerate silicon (Si) for use as the Si substrate F2 may, for example, be less than 16 mΩ·cm and is more preferably not more than 1.2 mΩ·cm.

The substrate made of degenerate silicon (Si) and included in the vibration part 120 yields improvements in the frequency-temperature characteristics of the vibration part 120.

A correction layer F1 is provided on the other principal surface of the Si substrate F2, namely, a lower surface located opposite the aforementioned principal surface (i.e., the upper surface) of the Si substrate F2. The correction layer F1 may, for example, have a thickness of about 0.5 μm and be made of silicon dioxide ($SiO_2$). The lower surface of the Si substrate F2 is an example of a second principal surface for purposes of this disclosure.

The addition of the correction layer F1 to the Si substrate F2 in the present embodiment enables, at least at or near room temperatures, a reduction in the temperature coefficient of the frequency in the vibration part 120, that is, a reduction in the rate of change in frequency per unit temperature. With the addition of the correction layer F1, the vibration part 120 exhibits improved temperature characteristics. This is due mainly to the reduced temperature dependence of the resonant frequency of the multilayer structure including the Si substrate F2, the metal layer E1, the piezoelectric thin film F3, and the correction layer F1.

The vibration part 120 includes the metal layer E1 and the piezoelectric thin film F3 disposed between the Si substrate F2 and the metal layer E1. The advantage of this structure is the ease with which to produce a piezoelectric resonator. The vibration part 120 also includes the metal layer E2 disposed between the Si substrate F2 and the piezoelectric thin film F3. This leads to the greater ease with which to produce a piezoelectric resonator. For purposes of this disclosure, the metal layer E1 is an example of a first electrode, and the metal layer E2 is an example of a second electrode.

The metal layers E1 and E2 may, for example, each have a thickness of about 0.2 μm. After being formed, the metal layers E1 and E2 are patterned by undergoing etching or the like and are formed into desired shapes. The metal layers E1 and E2 are formed from, for example, a metal whose crystal structure is a body-centered cubic structure. Specifically, the metal layer E1 is formed from, for example, molybdenum (Mo) or tungsten (W).

The metal layer E1 is shaped in conformance with the outline of the vibration part 120. The length in the Y-axis direction of the metal layer E1 viewed in plan is substantially equal to the length L in the Y-axis direction of the vibration part 120, and the width in the X-axis direction of the metal layer E1 viewed in plan is substantially equal to the width W in the X-axis direction of the vibration part 120. The metal layer E1 is not necessarily shaped in conformance with the outline of the vibration part 120. It is only required that the metal layer E1 extend from one end to the other end in the Y-axis direction of the vibration part 120.

For example, part of the metal layer E1 is included in the vibration part 120 and is intended as an upper electrode. The remaining part of the metal layer E1 is included in the support arm 111 and the holding part 140 and is intended as wiring for connecting the upper electrode to an alternating-current power supply disposed outside the resonator 10.

It is noted that according to the exemplary embodiment, part of the metal layer E2 is included in the vibration part 120 and is intended as a lower electrode. The remaining part of the metal layer E2 is included in the support arm 111 and the holding part 140 and is intended as wiring for connecting the lower electrode to circuitry disposed outside the resonator 10.

The Si substrate F2 may act as a lower electrode, in which case the metal layer E2 may be omitted.

In an exemplary aspect, the piezoelectric thin film F3 is a thin film made of a piezoelectric material and transforms applied voltage into vibrations. The piezoelectric thin film F3 is made of a material having a wurtzite hexagonal crystal structure. For example, the piezoelectric thin film F3 includes, as a principal component, a nitride or an oxide, and more specifically, aluminum nitride (AlN), scandium aluminum nitride (ScAlN), zinc oxide (ZnO), gallium nitride (GaN), or indium nitride (InN). Scandium aluminum nitride is obtained by substituting part of aluminum in aluminum nitride with scandium. Instead of being substituted with scandium, part of aluminum in aluminum nitride may be substituted with magnesium (Mg) and niobium (Nb), with magnesium (Mg) and zirconium (Zr), or with any other two elements. The piezoelectric thin film F3 has a thickness of 0.8 μm. In some embodiments, the thickness of the piezoelectric thin film F3 may be in the range of about 0.2 μm to about 2 μm.

The piezoelectric thin film F3 is a film with c-axis orientation; that is, constituent particles are aligned in the thickness direction of the Si substrate F2 (i.e., in the Z-axis direction).

Moreover, the protective film 125 may be a piezoelectric film made of aluminum nitride (AlN), scandium aluminum nitride (ScAlN), zinc oxide (ZnO), gallium nitride (GaN), or indium nitride (InN) or may be an insulating film made of silicon nitride (SiN), silicon dioxide ($SiO_2$), or aluminum oxide ($Al_2O_3$). The protective film 125 may, for example, have a thickness of about 0.2 μm. The protective film 125 included in the vibration part 120 inhibits oxidation of the metal layer E1 acting as an upper electrode for generating piezoelectric vibrations.

The vibration part 120 includes a vibration region corresponding to the metal layer E1 acting as an upper electrode. As illustrated in FIG. 4, an electric field is applied between the metal layer E1 and the metal layer E2. With the application of an electric field, the piezoelectric thin film F3 in the vibration region expands and contracts along the X-Y plane. More specifically, an electric field is applied between the metal layer E1 and the metal layer E2 to form a predetermined potential difference between the metal layer E1 and the metal layer E2. With constituent particles in the piezoelectric thin film F3 being aligned in the thickness direction, the piezoelectric thin film F3 vibrates in the contour vibration mode along the X-Y plane in accordance with the potential difference. The vibration region of the vibration part 120 undergoes vibration such that the vibration part 120 alternately contracts and expands in both the width direction (i.e., the X-axis direction) and the longitudinal direction (i.e., in the Y-axis direction).

For purposes of this disclosure, the term "contour vibration" can herein refer to any of the following: expansion vibrations; width expansion vibrations involving dimensional changes in the width direction (the X-axis direction); and expansion-contraction vibrations involving expansion and contraction in the longitudinal direction (i.e., the Y-axis direction).

Figure 6:
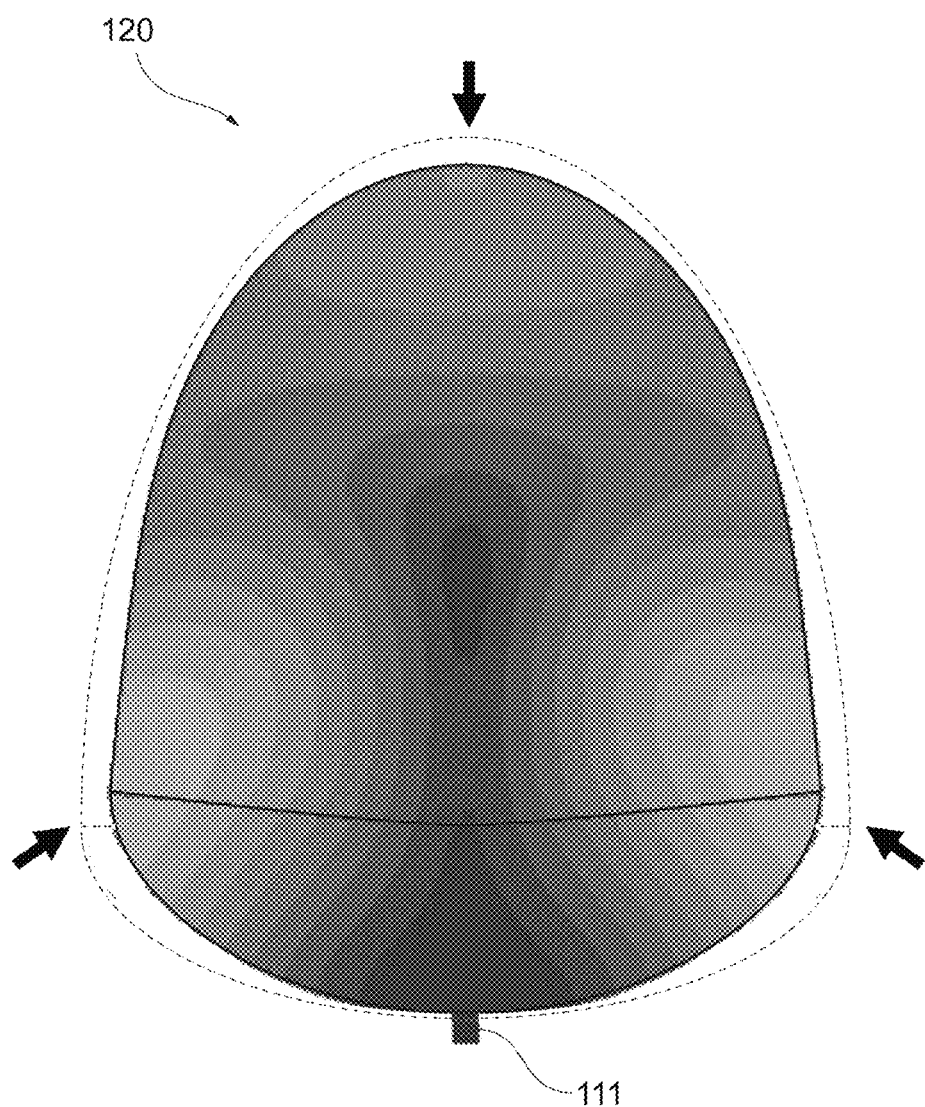
FIG. 6 is a plan view of a vibration part in FIG. 3, schematically illustrating a mode in which the vibration part vibrates.

The following describes displacement associated with vibrations of the vibration part with reference to FIGS. 6 and 7 under the assumption that the vibration part 120 does not include the metal layer E2 illustrated in FIGS. 4 and 5 and includes the correction layer F1 having a thickness of 0.5 μm, the Si substrate F2 having a thickness of 24 μm, the piezoelectric thin film F3 having a thickness of 0.8 μm, the metal layer E1 having a thickness of 0.2 μm, and the protective film 125 having a thickness of 0.2 μm. FIGS. 6 and 7 are plan views of the vibration part 120 in FIG. 3, illustrating a mode in which the vibration part 120 vibrates. Referring to FIGS. 6 and 7, lightly colored regions of the vibration part 120 undergo large displacements, and highly colored regions of the vibration part 120 undergo small displacements relative to each other.

In some configurations, the vibration part 120 contracts in the X-Y plane as illustrated in FIG. 6. More specifically, three spots marked with bold arrows in FIG. 6 undergo large displacements in a manner so as to contract toward the midsection of the vibration part 120. With an end portion (the lower end portion in FIG. 6) of the vibration part 120 being connected with the support arm 111, the end portion and the midsection of the vibration part 120 undergo small displacements.

In other configurations, the vibration part 120 expands in the X-Y plane as illustrated in FIG. 7. More specifically, three spots marked with bold arrows in FIG. 7 undergo large displacements in a manner so as to expand away from the midsection of the vibration part 120. As in the previous case, the midsection of the vibration part 120 and the end portion (the lower end portion of the vibration part 120 in FIG. 7) connected with the support arm 111 undergo small displacements.

Figure 8:
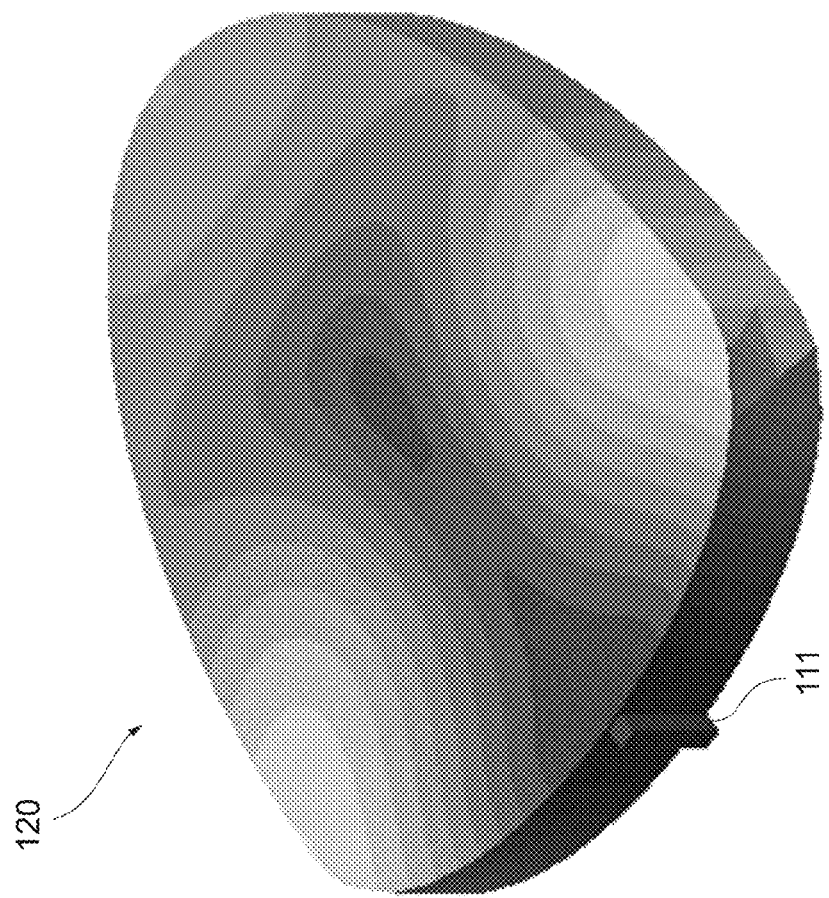
FIG. 8 is a perspective view of the vibration part in FIG. 3, schematically illustrating the distribution of displacements associated with vibrations of the vibration part.
Figure 9:
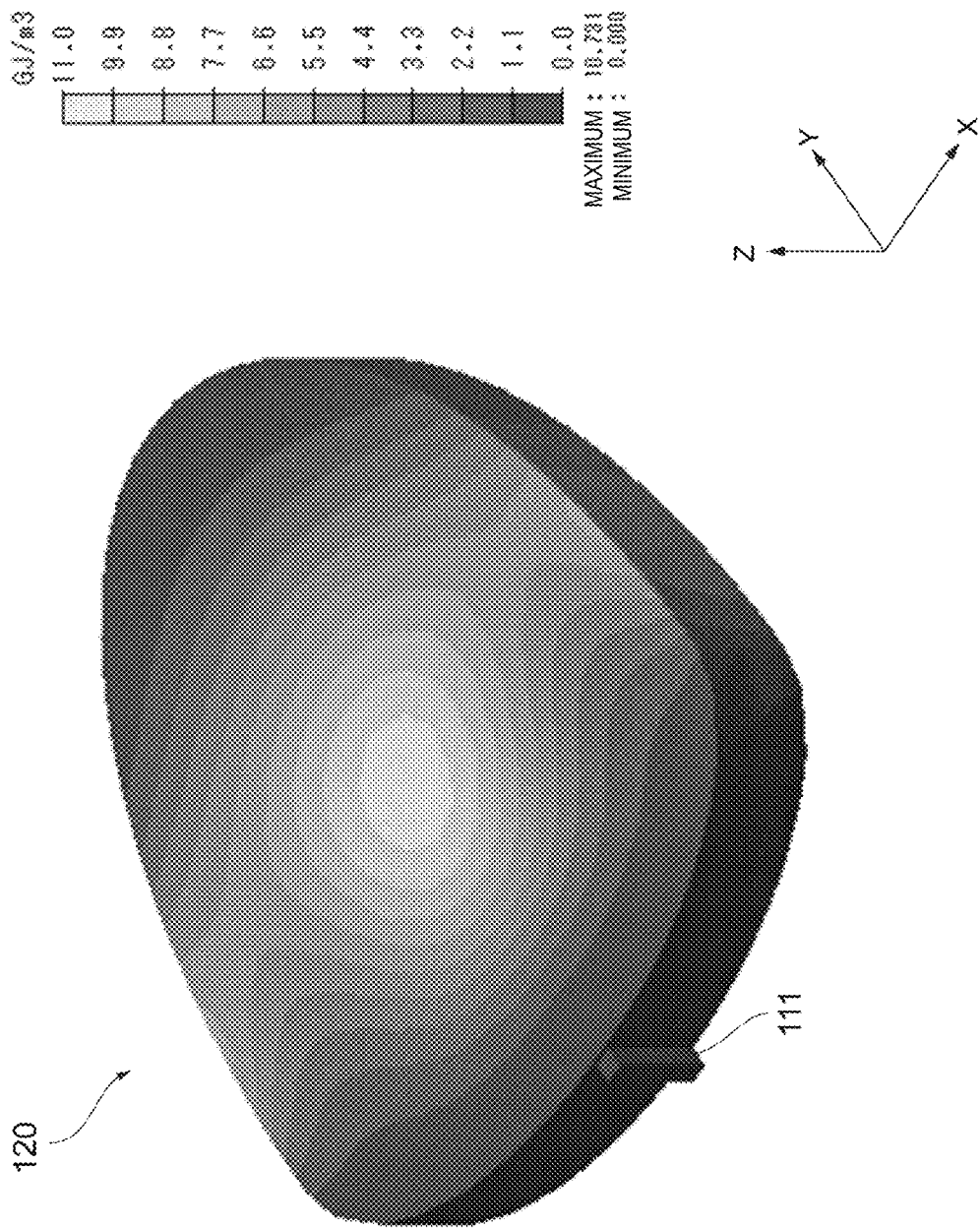
FIG. 9 is a perspective view of the vibration part in FIG. 3, schematically illustrating the distribution of distortions associated with vibrations of the vibration part.

The following describes the distribution of displacements and distortions associated with vibrations of the vibration part with reference to FIGS. 8 and 9 under the assumption that the multilayer structure of the vibration part 120 illustrated in FIGS. 8 and 9 is identical to that of the vibration part 120 described above with reference to FIGS. 6 and 7. It is noted that FIG. 8 is a perspective view of the vibration part 120 in FIG. 3, schematically illustrating the distribution of displacements associated with vibrations of the vibration part 120. Moreover, FIG. 9 is a perspective view of the vibration part 120 in FIG. 3, schematically illustrating the distribution of distortions associated with vibrations of the vibration part 120. Referring to FIG. 8, lightly colored regions of the vibration part 120 undergo large displacements, and highly colored regions of the vibration part 120 undergo small displacements. Referring to FIG. 9, lightly colored regions of the vibration part 120 undergo high levels of distortion, and highly colored regions of the vibration part 120 undergo low levels of distortion.

As can be seen from FIG. 8, the three spots in the vibration part 120 that are marked with bold arrows in FIGS. 6 and 7 undergo large displacements, and the rest of the vibration part 120 or, more specifically, the midsection and the end portion connected with the support arm 111 undergo small displacements.

As can be seen from FIG. 9, the midsection of the vibration part 120 undergoes high levels of distortion, and the rest of the vibration part 120 or, more specifically, the three spots marked with bold arrows in FIGS. 6 and 7 and the end portion connected with the support arm 111 undergo low levels of distortion. It can thus be concluded that the end portion of the vibration part 120 undergoes small displacements and low levels of distortion. As illustrated in FIG. 3, when the upper surface of the vibration part 120 is viewed in plan, the width W in the X-axis direction is at its maximum Wmax at a point on the Y axis, and the width W progressively decreases with increasing proximity to one of two end portions in the Y-axis direction of the vibration part 120 and with increasing proximity to the other end portion in the Y-axis direction of the vibration part 120. According to the exemplary embodiment, the vibration part 120 shaped as above offers the following advantage: an end portion of the vibration part includes a node region in which the amount of displacement associated with the contour vibration is small and the level of distortion associated with the contour vibration is low. The presence of the node region eliminates or reduces the possibility that energy will escape due to distortions as well as displacements, thus leading to a further improvement in the prevention of escape of vibrations.

As described above with reference to FIG. 3, the point on the Y axis at which the width W in the X-axis direction is at its maximum Wmax is not located on the center line CL2 passing through the center in the Y-axis direction of the vibration part 120. The advantage of this geometry is the ease with which a region subject to small displacements and low levels of distortion can be formed in an end portion in the Y-axis direction of the vibration part 120.

As described above, the point on the Y axis at which the width W in the X-axis direction is at its maximum Wmax is closer than the center line CL2 passing through the center in the Y-axis direction of the vibration part 120 to one of two end portions in the Y-axis direction (the end portion on the negative side in the Y-axis direction in FIG. 3) of the vibration part 120. The advantage of this geometry is the ease with which a region subject to small displacements and low levels of distortion can be formed in one of two end portions in the Y-axis direction (the lower end in FIG. 3) of the vibration part 120.

In general, the vibration part 120 of the resonator 10 in the present embodiment is a piezoelectric resonator including the piezoelectric thin film F3. In some embodiments, the vibration part 120 of the resonator 10 may be a ceramic resonator including a ceramic film or an electrostatic resonator including an electrostatic film. Electrostatic resonators are also known as electrostatic vibrators.

The resonator 10 in the present embodiment includes the support arm 111 that is rectangular in shape when viewed in plan. In some embodiments, the vibration part 120 and the holding part 140 may be connected to each other by any other means.

Modifications of the Exemplary Embodiment

Figure 10:
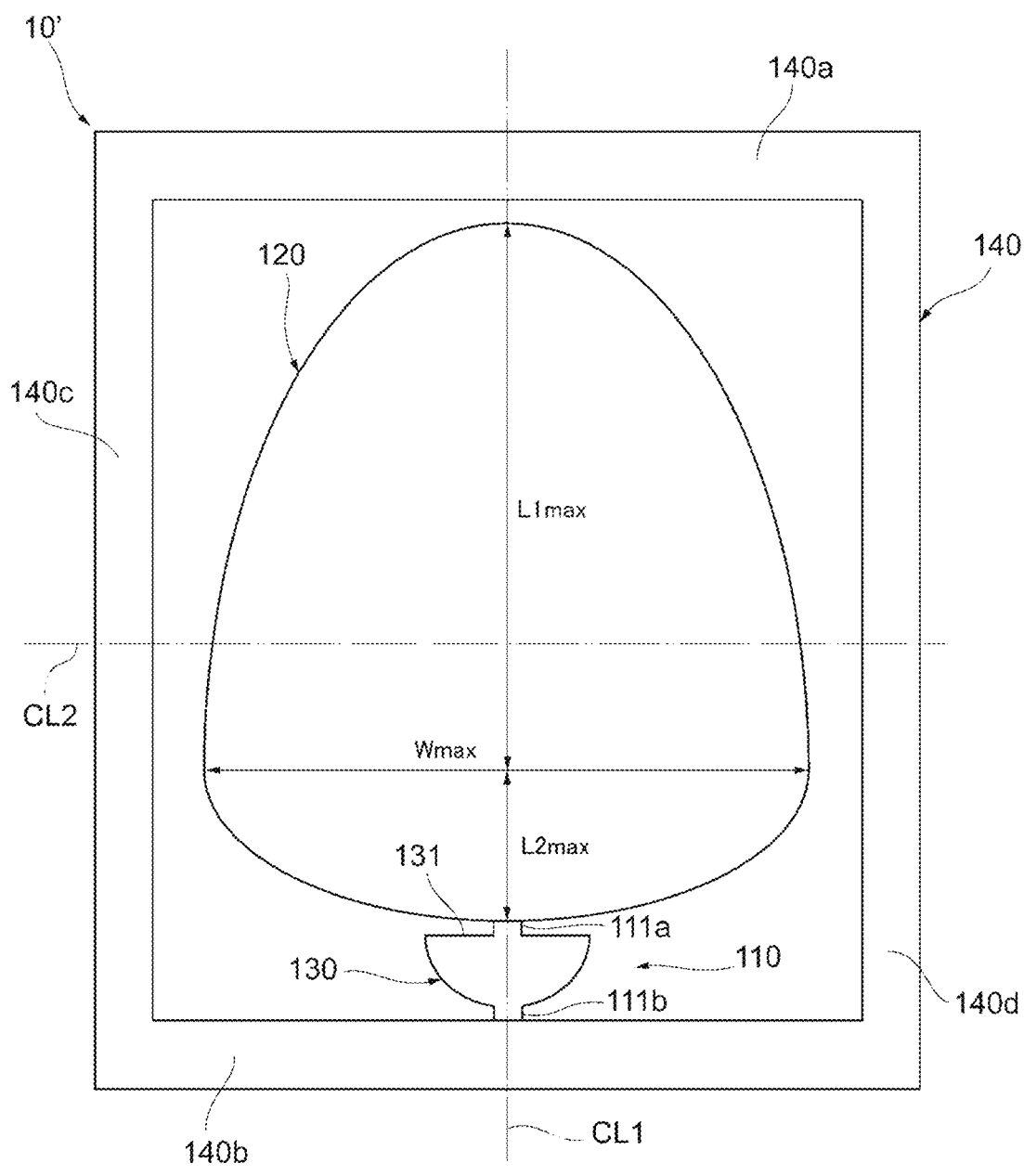
FIG. 10 is a plan view of a modification of the resonator in FIG. 3.

FIG. 10 is a plan view of a modification of the resonator 10 in FIG. 3. FIG. 10 illustrates a resonator 10', which has a multilayer structure. The multilayer structure of the resonator 10' is identical to the multilayer structure of the resonator 10 illustrated in FIGS. 4 and 5 when viewed in section and will neither be illustrated nor described below.

Referring to FIG. 10, the resonator 10' includes a support unit 110 in place of the support arm 111 illustrated in FIG. 3. The support unit 110 is another example of the support part for purposes of this disclosure.

The support unit 110 is disposed on the inner side with respect to the holding part 140 or, more specifically, in a space between the frame member 140*b* and one of two end portions in the Y-axis direction (the lower end portion in FIG. 10) of the vibration part 120. The support unit 110 forms a connection between the end portion of the vibration part 120 and the frame member 140*b* of the holding part 140. The support unit 110 has a surface overlaid with the metal layer E1 mentioned above. The metal layer E1 (not illustrated) extends over both the vibration part 120 and the frame member 140*b*.

The support unit 110 in this modification includes a node generation part 130. The node generation part 130 is connected to the end portion of the vibration part 120 with an arm 111*a* therebetween. The node generation part 130 is also connected to the frame member 140*b* of the holding part 140 with an arm 111*b* therebetween. One side of the node generation part 130 faces the end portion of the vibration part 120 and is denoted by 131. The side 131 of the node generation part 130 is connected to the arm 111*a*.

As shown, the width in the X-axis direction of the node generation part 130 decreases with increasing distance from the arm 111*a* and with increasing proximity to the arm 111*b*. The node generation part 130 is symmetric about the perpendicular bisector of the side 131. A point at which the width in the Y-axis direction of the node generation part 130 is at its maximum is closer than the center in the Y-axis direction of the node generation part 130 to the arm 111*a*. The width in the X-axis direction of the node generation part 130 in the modification illustrated in FIG. 10 is at its maximum on the side 131. The width gradually decreases with increasing distance from the arm 111*a* and with increasing proximity to the arm 111*b* and is at its minimum at a junction of the arm 111*b* and the apex of the node generation part 130. Moreover, the width in the Y-axis direction of the node generation part 130 does not necessarily decrease in a continuous manner. For example, the width may decrease stepwise or increase in some places in such a manner that the node generation part 130 as a whole tapers down. The peripheral edges of the node generation part 130 may be smooth or may contain protrusions and indentations.

As shown, the node generation part 130 in this modification may, for example, be a half of a circle having a radius of about 30 μm and a diameter coinciding with the side 131. When being shaped as above, the node generation part 130 has an arc that is a segment of a circle centered around the midpoint of the side 131. Alternatively, the arc of the node generation part 130 may be a segment of a circle centered around the center of the arm 111*b*. However, it is noted that it is not required that the side 131 be a straight line. The side 131 may be arc-shaped, in which case the arm 111*a* is connected to the apex on the side 131. In this case, the side 131 may be an arc that is a segment of a circle centered around a point closer to the arm 111*a* or a segment of a circle centered around a point closer to the arm 111*b*. The side 131 is preferably longer than the width of the arm 111*a* in the X-axis direction and is preferably shorter than the short side of the vibration part 120.

The width in the X-axis direction of the node generation part 130 of the support unit 110 in this modification gradually decreases with increasing distance from the arm 111*a* and with increasing proximity to the arm 111*b*. It is thus ensured that in the node generation part 130, spots subject to large vibration displacements are adjacent to spots subject to small vibration displacements, irrespective of fluctuations in the propagation of vibrations from the vibration part 120. With the escape of vibrations from the vibration part 120, sites of displacements in the node generation part 130 are shifted such that a vibration node is formed on the node generation part 130. The node generation part 130 is connected to the arm 111*a* at the node and inhibits propagation of vibrations from the vibration part 120 to the holding part 140 accordingly. This configuration leads to anchor loss reduction in the resonator 10, and the Q factor of the resonator 10 may be increased correspondingly.

Second Exemplary Embodiment

The following describes a resonance device and a resonator according to a second embodiment of the present invention with reference to FIGS. 11 to 15. It is noted that each element in the first embodiment and the corresponding (identical or similar) element in the second embodiment are denoted by the same or similar reference sign. The following describes features different from those of the first embodiment. Similar effects attributable to similar configurations will not be fully described in the following description.

Figure 11:
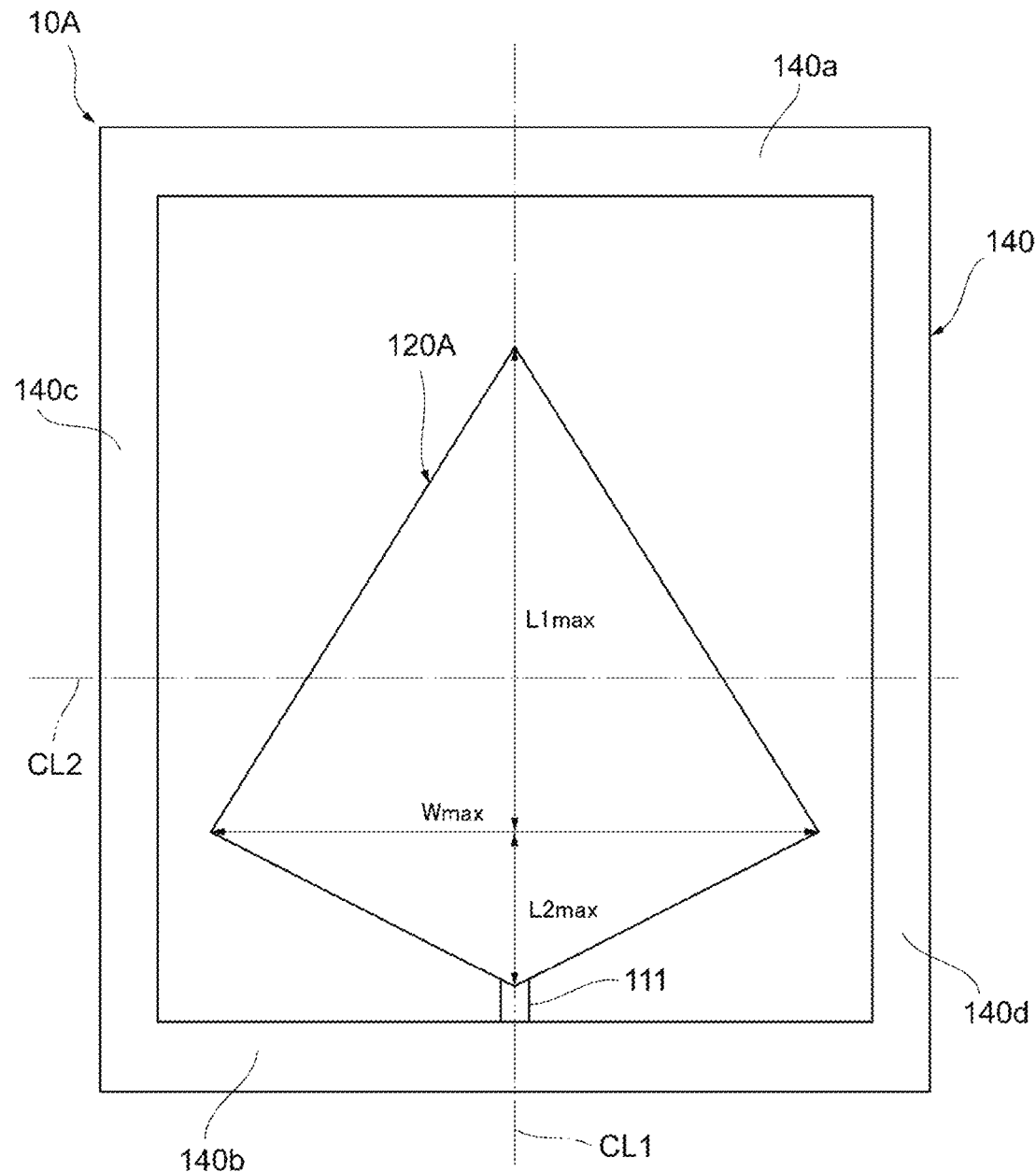
FIG. 11 is a plan view of a resonator according to a second exemplary embodiment, schematically illustrating the structure of the resonator.

The following provides an overview of the configuration of the resonator according to the second embodiment of the present invention with reference to FIG. 11. FIG. 11 is a plan view of a resonator 10A according to the second embodiment, schematically illustrating the structure of the resonator 10A. FIG. 11 is a plan view analogous to FIG. 3 illustrating the first embodiment.

Referring to FIG. 11, the resonator 10A according to the second embodiment includes a vibration part 120A. The outline of the vibration part 120A in the X-Y plane differs from that of the vibration part 120 of the resonator 10 according to the first embodiment.

As shown, when viewed in the plan view, the vibration part 120A has a shape that is a combination of two triangles or, more specifically, two isosceles triangles, with the base of one triangle coinciding with the base of the other triangle. As with the vibration part 120 according to the first embodiment, the vibration part 120A may be composed of two members or may be a single member.

Moreover, the lengths in the Y-axis direction of two triangular portions forming the vibration part 120A are denoted by L. The length L of one of the triangular portions is at its maximum L1max at a point on a line passing through the vertex angle of the triangle. The length L of the other triangular portion is at its maximum L2max at a point on a line passing through the vertex angle of the triangle.

The width in the X-axis direction of the vibration part 120A is denoted by W and is at its maximum Wmax at a point on a boundary between the two triangular portions. With the width W in the X-axis direction of the vibration part 120A being at its maximum Wmax at the point on the Y axis, the width W progressively decreases with increasing proximity to one of two end portions in the Y-axis direction (i.e., a lower end portion in FIG. 11) of the vibration part 120A and with increasing proximity to the other end portion in the Y-axis direction (i.e., an upper end portion in FIG. 11) of the vibration part 120A. according to the exemplary embodiment, the vibration part 120A shaped as above offers the following advantage: an end portion of the vibration part includes a node region in which the amount of displacement associated with the contour vibration is small and the level of distortion associated with the contour vibration is low.

As illustrated in FIG. 11, the point on the Y axis at which the width W in the X-axis direction is at its maximum Wmax is not located on a center line CL2, which passes through the center in the Y-axis direction of the vibration part 120A. Instead, the point concerned is closer than the center line CL2 passing through the center in the Y-axis direction of the vibration part 120A to one of two end portions in the Y-axis direction (the end portion on the negative side in the Y-axis direction in FIG. 11) of the vibration part 120A.

In the present embodiment, the maximum L1max of the length L in the Y-axis direction of one of the two triangular portions is 0.8 times the maximum Wmax of the width W in the X-axis direction. Moreover, the maximum L2max of the length L in the Y-axis direction of the other triangular portion is 0.25 times the maximum Wmax of the width W in the X-axis direction. The maximum Wmax of the width W in the X-axis direction may be about 160 μm. With the length L in the Y-axis direction being greater than the width W in the X-axis direction, the vibration part 120A is long in the Y-axis direction.

An end portion (the lower end portion in FIG. 11) of the vibration part 120A is connected with a support arm 111.

Figure 13:
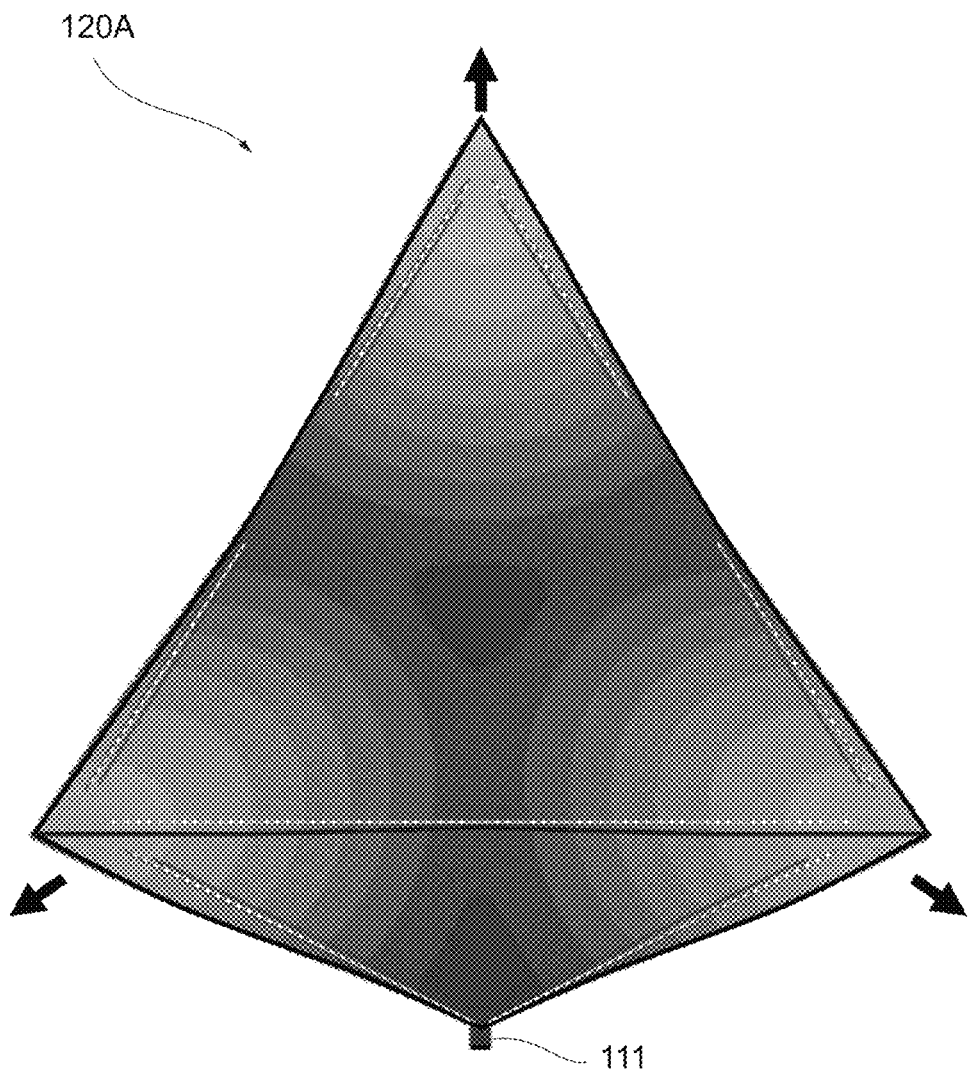
FIG. 13 is a plan view of the vibration part in FIG. 11, schematically illustrating a mode in which the vibration part vibrates.

The following describes displacement associated with vibrations of the vibration part with reference to FIGS. 12 and 13 under the assumption that the multilayer structure of the vibration part 120A illustrated in FIGS. 12 and 13 is identical to that of the vibration part 120 described above with reference to FIGS. 6 and 7. FIGS. 12 and 13 are plan views of the vibration part 120A in FIG. 11, schematically illustrating a mode in which the vibration part 120A vibrates. Referring to FIGS. 12 and 13, lightly colored regions of the vibration part 120A undergo large displacements, and highly colored regions of the vibration part 120A undergo small displacements.

According to some configurations, the vibration part 120A contracts in the X-Y plane as illustrated in FIG. 12. More specifically, three spots marked with bold arrows in FIG. 12 undergo large displacements in a manner so as to contract toward the midsection of the vibration part 120A. With an end portion (the lower end portion in FIG. 12) of the vibration part 120A being connected with the support arm 111, the end portion and the midsection of the vibration part 120A undergo small displacements.

In other configurations, the vibration part 120A expands in the X-Y plane as illustrated in FIG. 13. More specifically, three spots marked with bold arrows in FIG. 13 undergo large displacements in a manner so as to expand away from the midsection of the vibration part 120A. The midsection of the vibration part 120A and the end portion (the lower end portion of the vibration part 120A in FIG. 13) connected with the support arm 111 undergo small displacements.

Figure 14:
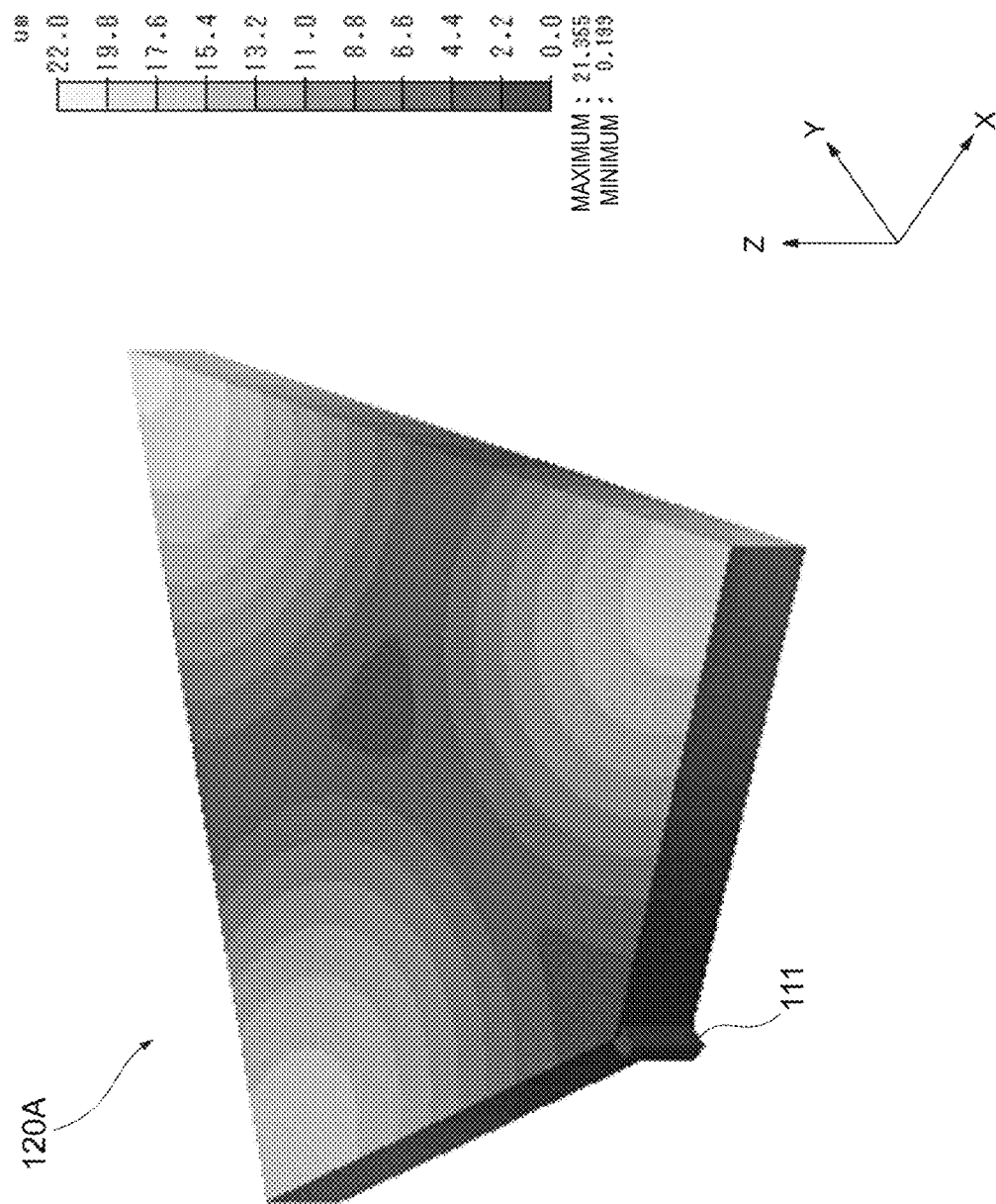
FIG. 14 is a perspective view of the vibration part in FIG. 11, schematically illustrating the distribution of displacements associated with vibrations of the vibration part.
Figure 15:
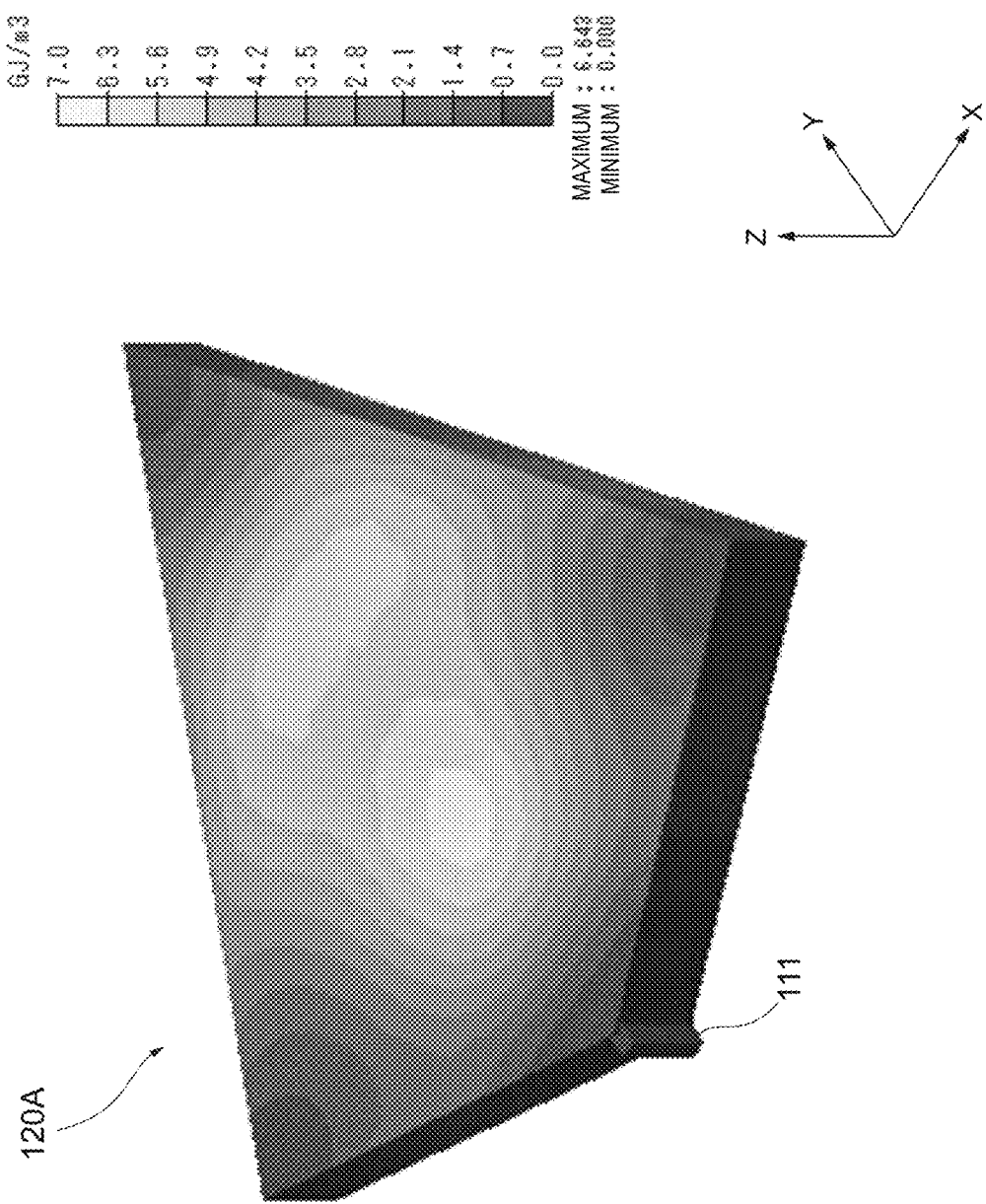
FIG. 15 is a perspective view of the vibration part in FIG. 11, schematically illustrating the distribution of distortions associated with vibrations of the vibration part.

The following describes the distribution of displacements and distortions associated with vibrations of the vibration part with reference to FIGS. 14 and 15 under the assumption that the multilayer structure of the vibration part 120A illustrated in FIGS. 14 and 15 is identical to that of the vibration part 120 described above with reference to FIGS. 6 and 7. FIG. 14 is a perspective view of the vibration part 120A in FIG. 11, schematically illustrating the distribution of displacements associated with vibrations of the vibration part 120A. FIG. 15 is a perspective view of the vibration part 120A in FIG. 11, schematically illustrating the distribution of distortions associated with vibrations of the vibration part 120A. Referring to FIG. 14, lightly colored regions of the vibration part 120A undergo large displacements, and highly colored regions of the vibration part 120A undergo small displacements. Referring to FIG. 15, lightly colored regions of the vibration part 120A undergo high levels of distortion, and highly colored regions of the vibration part 120A undergo low levels of distortion.

As can be seen from FIG. 14, the three spots in the vibration part 120A that are marked with bold arrows in FIGS. 12 and 13 undergo large displacements. Moreover, the midsection of the vibration part 120A and the end portion of the vibration part 120A or, more specifically, the end portion connected with the support arm 111 undergo small displacements.

As can be seen from FIG. 15, the midsection of the vibration part 120A undergoes high levels of distortion. The three spots marked with bold arrows in FIGS. 12 and 13 and the end portion of the vibration part 120A or, more specifically, the end portion connected with the support arm 111 undergo low levels of distortion. It can thus be concluded that the end portion of the vibration part 120A undergoes small displacements and low levels of distortion. As illustrated in FIG. 11, when the upper surface of the vibration part 120A is viewed in plan, the width W in the X-axis direction is at its maximum Wmax at a point on the Y axis, and the width W progressively decreases with increasing proximity to one of two end portions in the Y-axis direction of the vibration part 120A and with increasing proximity to the other end portion in the Y-axis direction of the vibration part 120A. The vibration part 120A shaped as above offers the following advantage: an end portion of the vibration part includes a node region in which the amount of displacement associated with the contour vibration is small and the level of distortion associated with the contour vibration is low. The resonator 10A according to the present embodiment produces effects similar to those produced by the resonator 10 according to the first embodiment. Likewise, a resonance device including the resonator 10A produces effects similar to those produced by the resonance device 1 according to the first embodiment.

Third Exemplary Embodiment

Figure 16:
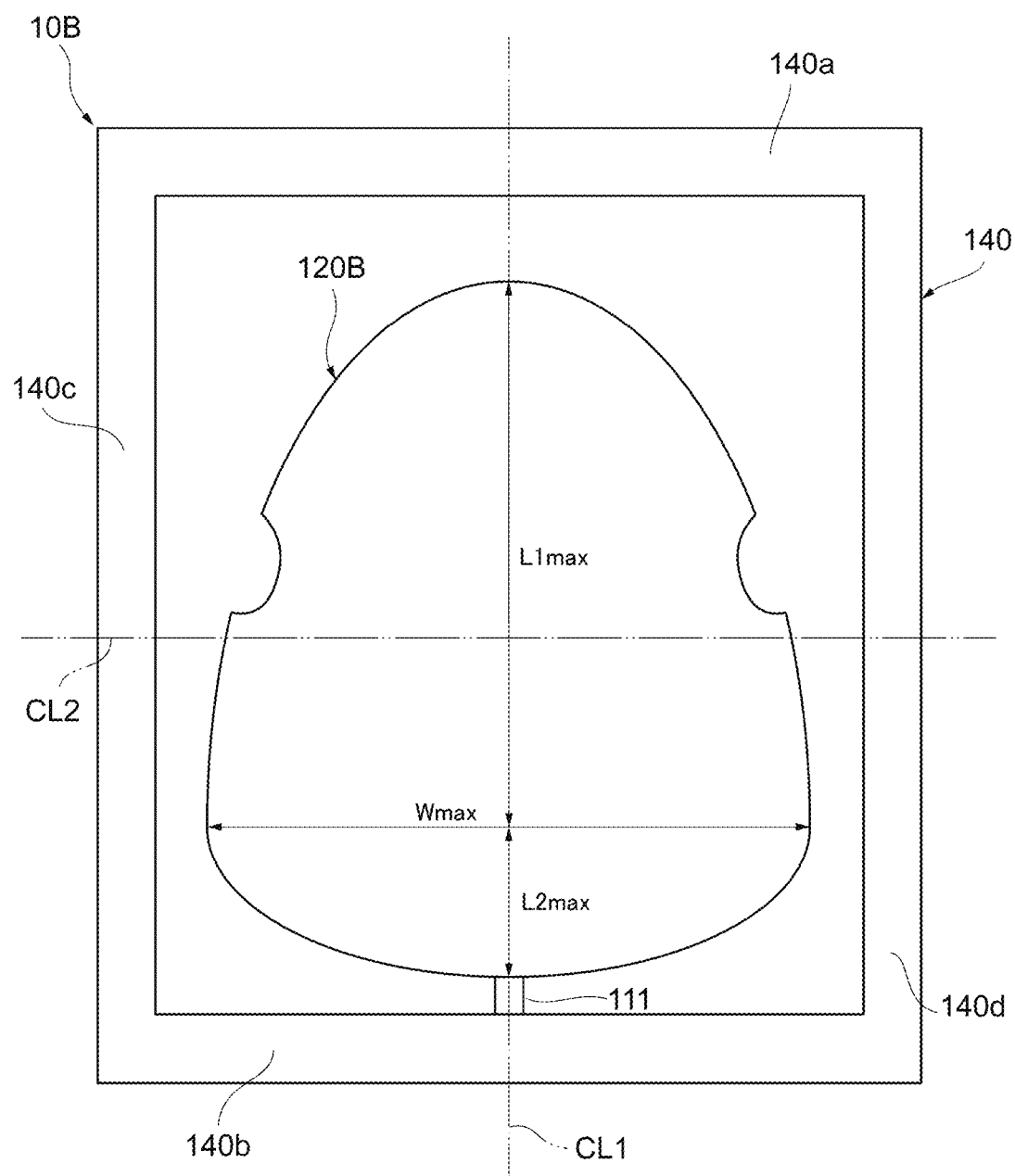
FIG. 16 is a plan view of a first example of a resonator according to a third exemplary embodiment, schematically illustrating the structure of the resonator.
Figure 17:
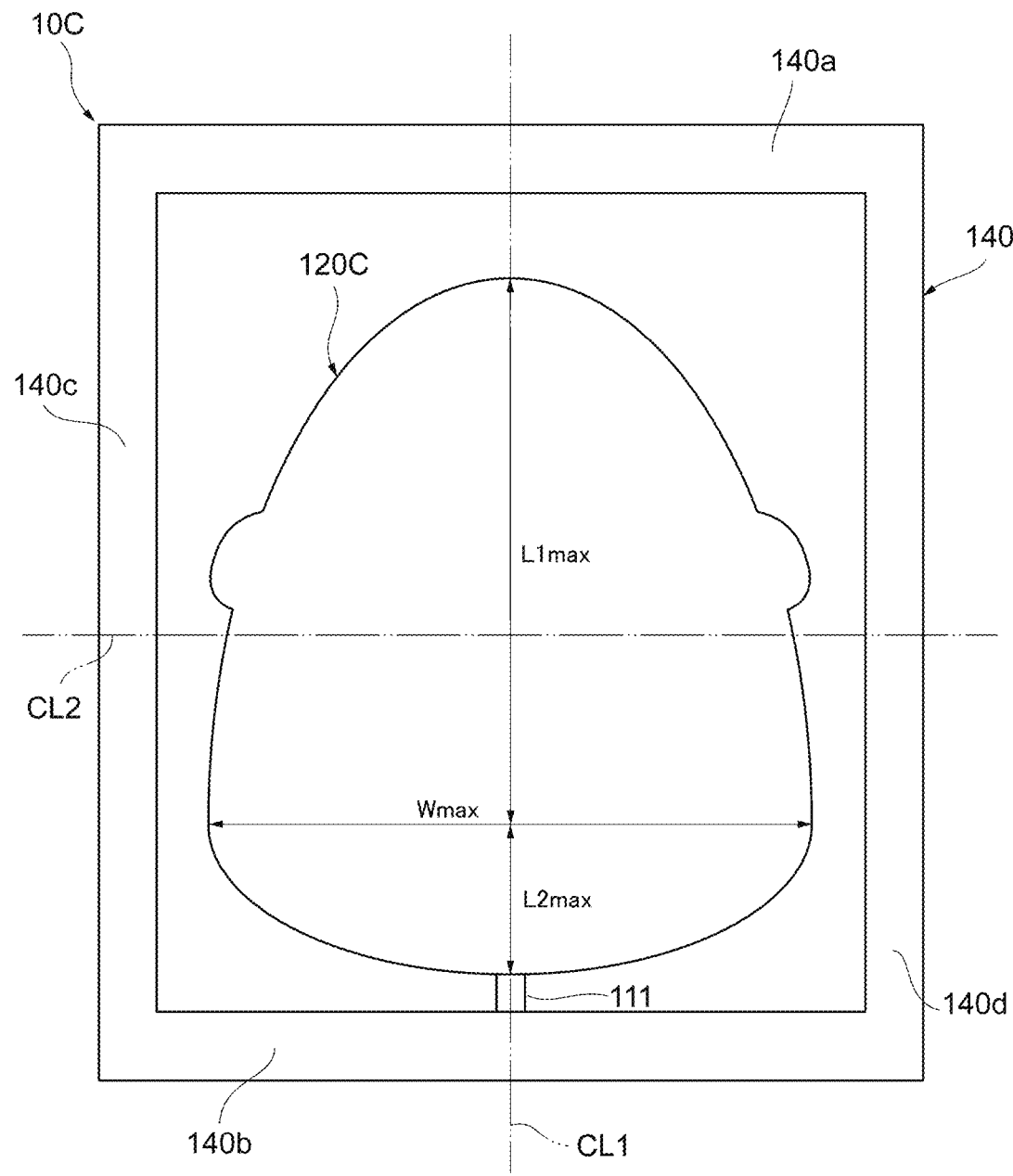
FIG. 17 is a plan view of a second example of the resonator according to the third exemplary embodiment, schematically illustrating the structure of the resonator.

The following describes a resonance device and a resonator according to a third embodiment of the present invention with reference to FIGS. 16 to 17. It is noted that each element in the third embodiment and the corresponding (identical or similar) element in the first or second embodiment are denoted by the same or similar reference sign. The following describes features different from those of the first and second embodiments. Similar effects attributable to similar configurations will not be fully described in the following description.

The following provides an overview of the configuration of the resonator according to the third embodiment of the present invention with reference to FIGS. 16 and 17. FIG. 16 is a plan view of a resonator 10B, schematically illustrating the structure of the resonator 10B. The resonator 10B is a first example of the resonator according to the third embodiment. FIG. 17 is a plan view of a resonator 10C, schematically illustrating the structure of the resonator 10C. The resonator 10C is a second example of the resonator according to the third embodiment. FIGS. 16 and 17 are plan views analogous to FIG. 3 illustrating the first embodiment.

Referring to FIGS. 16 and 17, the resonator 10B and the resonator 10C according to the third embodiment include a vibration part 120B and a vibration part 120C, respectively. The outlines of the vibration part 120B and 120C in the X-Y plane each differ from that of the vibration part 120 of the resonator 10 according to the first embodiment and from that of the vibration part 120A of the resonator 10A according to the second embodiment.

When viewed in the plan view, the vibration part 120B and the vibration part 120C each have a shape that is a combination of a semi-ellipse and an approximate semi-ellipse having recesses or protrusions in some places, with the longer diameter of the semi-ellipse coinciding with the shorter diameter of the approximate semi-ellipse. As with the vibration part 120 according to the first embodiment, the vibration part 120B and the vibration part 120C may each be composed of two members or may each be a single member.

The lengths in the Y-axis direction of the semielliptical portion and the approximately semielliptical portion forming the vibration part 120B and the lengths in the Y-axis direction of the semielliptical portion and the approximately semielliptical portion forming the vibration part 120C are denoted by L. The length L of each of the approximately semielliptical portions is at its maximum L1max at a point through which the major axis of the corresponding approximate ellipse passes. The length L in the Y-axis direction of each of the semielliptical portions is at its maximum L2max at a point through which the minor axis of the corresponding ellipse passes.

The width in the X-axis direction of each of the vibration part 120B and the vibration part 120C is denoted by W and is at its maximum Wmax at a point on a boundary between the approximately semielliptical portion and the semispherical portion adjoining each other in the Y-axis direction. With the width W in the X-axis direction of each of the vibration part 120B and the vibration part 120C being at its maximum Wmax at the point on the Y axis, the width W decreases with increasing proximity to one of two end portions in the Y-axis direction (i.e., a lower end portion in FIG. 16 or 17) of the vibration part and with increasing proximity to the other end portion in the Y-axis direction (i.e., an upper end portion in FIG. 16 or 17) of the vibration part.

More specifically, the width W in the X-axis direction of each of the vibration part 120B and the vibration part 120C decreases progressively (i.e., gradually or little by little) with increasing proximity to one of two end portions in the Y-axis direction (i.e., the lower end portion in FIG. 16 or 17) and with increasing distance from the point on the Y axis at which the width W in the X-axis direction is at its maximum Wmax. In some places between the other end portion in the Y-axis direction (i.e., the upper end portion in FIG. 16 or 17) and the point on the Y axis at which the width W in the X-axis direction of each of the vibration part 120B and the vibration part 120C is at its maximum Wmax, the width W sharply decreases and increases without exceeding the maximum Wmax.

With sharp decreases and increases in the width W in the X-axis direction of each of the vibration part 120B and the vibration part 120C in some places between the other end portion in the Y-axis direction (i.e., the upper end portion in FIG. 16 or 17) and the point on the Y axis at which the width W in the X-axis direction is at its maximum Wmax, it is required that the width W be kept from exceeding its maximum Wmax. Likewise, the width W in the X-axis direction of each of the vibration part 120B and the vibration part 120C may sharply decrease and increase in some places (not illustrated) between the one of the two end portions in the Y-axis direction (i.e., the lower end portion in FIG. 16 or 17) and the point on the Y axis at which the width W in the X-axis direction is at its maximum Wmax. With sharp decreases and increases in some places, it is required that the width W be kept from exceeding its maximum Wmax. As with the vibration part 120 in the first embodiment, the vibration part 120B and the vibration part 120C shaped as above each offer the following advantage: an end portion of the vibration part includes a node region in which the amount of displacement associated with the contour vibration is small and the level of distortion associated with the contour vibration is low. The resonator 10B according to the present embodiment produces effects similar to those produced by the resonator 10 according to the first embodiment as described above. Likewise, a resonance device including the resonator 10B causes effects similar to those produced by the resonance device 1 in the first embodiment. The same holds true for the resonator 10C according to the present embodiment and for a resonance device including the resonator 10C.

As illustrated in FIGS. 16 and 17, the point on the Y axis at which the width W in the X-axis direction is at its maximum Wmax is not located on a center line CL2, which passes through the center in the Y-axis direction of the vibration part 120B or 120C. More specifically, the point concerned is closer than the center line CL2 passing through the center in the Y-axis direction of the vibration part 120B or 120C to one of two end portions in the Y-axis direction (the end portion on the negative side in the Y-axis direction in FIG. 16 or 17) of the vibration part 120B or 120C.

In general, it is noted that exemplary embodiments that have been described so far are presented as examples of the present invention. When one of two principal surfaces of a substrate of a vibration part of a resonator according to an embodiment of the present invention is viewed in plan, the width in the X-axis direction of the principal surface is at its maximum at a point on the Y axis and decreases with increasing proximity to one of two end portions in the Y-axis direction of the vibration part and with increasing proximity to the other end portion in the Y-axis direction of the vibration part. According to the exemplary embodiments, the vibration part shaped as above offers the following advantage: an end portion of the vibration part includes a node region in which the amount of displacement associated with the contour vibration is small and the level of distortion associated with the contour vibration is low. The presence of the node region eliminates or reduces the possibility that energy will escape due to distortions as well as displacements, thus leading to a further improvement in the prevention of escape of vibrations.

The point on the Y axis at which the width in the X-axis direction of the principal surface of the substrate of the vibration part of the resonator is at its maximum is not located on the center line passing through the center in the Y-axis direction of the vibration part. The advantage of this geometry is the ease with which a region subject to small displacements and low levels of distortion can be formed in one of two end portions in the Y-axis direction of the vibration part.

The point on the Y axis at which the width in the X-axis direction of the principal surface of the substrate of the vibration part of the resonator is at its maximum is closer than the center line passing through the center in the Y-axis direction of the vibration part to one of two end portions in the Y-axis direction of the vibration part. The advantage of this geometry and configuration is the ease with which a region subject to small displacements and low levels of distortion can be formed in an end portion in the Y-axis direction of the vibration part.

Moreover, the length in the Y-axis direction of the principal surface of the substrate of the vibration part of the resonator is greater than the width in the X-axis direction of the principal surface. This configuration leads to the ease with which to produce a resonator that enables a further improvement in the prevention of escape of vibrations.

The resonator includes a support arm or a support unit that is connected to the midsection in the X-axis direction of the one of the two end portions of the vibration part. This configuration leads to the ease with which to produce a resonator that enables a further improvement in the prevention of escape of vibrations.

The vibration part of the resonator includes a metal layer and a piezoelectric thin film disposed between the metal layer and an Si substrate. This configuration leads to the ease with which to produce a piezoelectric resonator that enables a further improvement in the prevention of escape of vibrations.

The vibration part of the resonator also includes a metal layer disposed between the Si substrate and the piezoelectric thin film. This configuration leads to the greater ease with which to produce a piezoelectric resonator that enables a further improvement in the prevention of escape of vibrations.

The vibration part of the resonator also includes a protective film with which the metal layer is overlaid. Advantageously, the protective film inhibits oxidation of the metal layer acting as an upper electrode for generating piezoelectric vibrations.

The substrate included in the vibration part of the resonator is made of silicon (Si). The substrate made of Si provides added mechanical strength to the vibration part.

The substrate included the vibration part of the resonator is made of degenerate silicon (Si). The substrate made of degenerate silicon (Si) yields improvements in the frequency-temperature characteristics of the vibration part.

Moreover, the vibration part of the resonator also includes a correction layer on the other principal surface of the Si substrate. With the addition of the correction layer, the vibration part exhibits improved temperature characteristics. This is due mainly to the reduced temperature dependence of the resonant frequency of the multilayer structure including the Si substrate, the metal layer, the piezoelectric thin film, and the correction layer.

A resonance device according to an exemplary embodiment includes the resonator, an upper cover, and a lower cover. This configuration leads to the ease with which to produce a resonance device that enables a further improvement in the prevention of escape of vibrations.

The embodiments above have been described to facilitate the understanding of the present invention and should not be construed as limiting the scope of the present invention. The present invention may be altered and/or improved without departing from the spirit of the present invention and embraces equivalents thereof. That is, the embodiments and/or modifications thereof with design changes made as appropriate by those skilled in the art fall within the scope of the present invention as long as the features of the present invention are involved. For example, constituent elements in the embodiments above and/or modifications thereof and the arrangement, materials, conditions, shapes, and sizes of the constituent elements are not limited to those mentioned in the description and may be changed as appropriate. The embodiments and modifications described herein are merely examples. Needless to say, partial replacements or combinations of configurations illustrated according to different embodiments and/or modifications thereof are possible and fall within the scope of the present invention as long as the features of the present invention are involved.

REFERENCE SIGNS LIST 1 resonance device
10, 10', 10A, 10B, 10C resonator
20 lower cover
21 recess
22 bottom plate
23 side wall
30 upper cover
31 recess
33 side wall
110 support unit
111 support arm
111a, 111b arm
120, 120A, 120B, 120C vibration part
125 protective film
130 node generation part
131 side
140 holding part
140a, 140b, 140c, 140d frame member
CL1 center line
CL2 center line
E1 metal layer
E2 metal layer
F1 correction layer
F2 Si substrate
F3 piezoelectric thin film
L length
L1max maximum
L2max maximum
W width
Wmax maximum

The invention claimed is:

1. A resonator, comprising:
a vibration part including a substrate having a first principal surface with a width in a first direction and a length in a second direction, with the vibration part being constructed to vibrate in a contour vibration mode;
a frame that at least partially surrounds the vibration part; and
a single connection arm that extends in the second direction and that directly connects the frame to only a first end of two ends of the vibration part in the second direction, such that a second end of the two ends of the vibration part is not directly attached to the frame,
wherein, when the first principal surface of the substrate is viewed in a plan view thereof, the width in the first direction has a maximum value at a point in the second direction and decreases with increasing proximity and continuously to each of the first end and the second end of the two ends in the second direction of the vibration part, and
wherein the point is off a center line in the second direction of the vibration part.

2. The resonator according to claim 1, wherein the point is closer than the center line in the second direction of the vibration part to the first end of the two ends of the vibration part.

3. The resonator according to claim 1, wherein the length in the second direction is greater than the width in the first direction.

4. The resonator according to claim 1, wherein the connection arm is connected to a midsection in the first direction of the first end of the two ends.

5. The resonator according to claim 1, wherein the vibration part includes a first electrode and a piezoelectric layer disposed between the substrate and the first electrode.

6. The resonator according to claim 5, wherein the vibration part further includes a second electrode disposed between the substrate and the piezoelectric layer.

7. The resonator according to claim 5, wherein the vibration part further includes a protective film that overlays the first electrode.

8. The resonator according to claim 1, wherein the substrate comprises one of silicon and degenerate silicon.

9. The resonator according to claim 1, wherein the vibration part further include a correction layer disposed on a second principal surface of the substrate that opposes the first principal surface of the substrate.

10. The resonator according to claim 1, further comprising a node generation part coupled between the connection arm and the frame and having a width in the first direction that decreases as a distance increases from the connection arm towards the frame.

11. The resonator according to claim 1, wherein, when viewed in the plan view, the vibration part has a shape comprising two triangles with a base of a first triangle of the triangles coinciding with a base of second triangle of the triangles.

12. A resonance device, comprising:
the resonator according to claim 1; and
a cover disposed thereon.

13. A resonator comprising:
a vibration part including a substrate having a first principal surface with a width in a first direction and a length in a second direction, with the vibration part being constructed to vibrate in a contour vibration mode;
a frame that at least partially surrounds the vibration part; and
a connection arm that extends in the second direction and that connects the frame to one end of two ends of the vibration art in the second direction,
wherein, when the first principal surface of the substrate is viewed in a plan view thereof, the width in the first direction has a maximum value at a point in the second direction and decreases with increasing proximity to the one end of the two ends in the second direction of the vibration part and with increasing proximity to a second end of the two ends in the second direction, and
wherein, when viewed in the plan view, the vibration part has a shape comprising two semi-ellipses, with a shorter diameter of a first semi-ellipse coinciding with a longer diameter of a second semi-ellipse.

14. The resonator according to claim 13, wherein the first semi-ellipse has a maximum length at a point through which a major axis of the first semi-ellipse passes, and the second semi-ellipse has a maximum length at a point through which a minor axis of the second semi-ellipse passes.

15. The resonator according to claim 14, wherein the maximum length of the first semi-ellipse extends in the second direction and is 0.9 times the maximum value of the width in the first direction.

16. The resonator according to claim 15, wherein the maximum length of the second semi-ellipse extends in the second direction and is 0.25 times the maximum value of the width in the first direction.

17. A resonator, comprising:
a vibration member including a substrate having a principal surface with a width in a first direction and a length in a second direction;
a frame that at least partially surrounds the vibration member; and
a single connection arm that extends in the second direction and that directly connects the frame to only a first end of the vibration member, such that a second end of the vibration member is not directly attached to the frame,
wherein, when the principal surface of the substrate is viewed in a plan view thereof, the width in the first direction is longest at a point in the second direction and continuously decreases in width as the vibration member extends away from the point in the second direction towards each of the first and second ends of the vibration member, and
wherein the point is off a center line in the second direction of the vibration member and is closer than the center line in the second direction to the first end of the vibration member.

18. The resonator according to claim 17, wherein the vibration member is constructed to vibrate in a contour vibration mode.

* * * * *